United States Patent [19]
Vrba

[11] Patent Number: 5,473,770
[45] Date of Patent: Dec. 5, 1995

[54] FAULT-TOLERANT COMPUTER SYSTEM WITH HIDDEN LOCAL MEMORY REFRESH

[75] Inventor: Richard A. Vrba, Austin, Tex.

[73] Assignee: Tandem Computers Incorporated, Cupertino, Calif.

[21] Appl. No.: 25,229

[22] Filed: Mar. 2, 1993

[51] Int. Cl.$^6$ .............................. G06F 12/16; G11C 11/40
[52] U.S. Cl. ........................... 395/433; 371/21.1; 365/222
[58] Field of Search .................................. 371/10.1, 21.1; 364/246.91, 964.9; 395/575, 400; 365/222

[56] References Cited

U.S. PATENT DOCUMENTS

| | | |
|---|---|---|
| 4,369,510 | 1/1983 | Johnson et al. . |
| 4,543,629 | 9/1985 | Carey et al. . |
| 4,556,952 | 12/1985 | Brewer et al. . |
| 4,625,296 | 11/1986 | Shriver . |
| 4,631,701 | 12/1986 | Kappeler et al. . |
| 5,146,589 | 9/1992 | Peet, Jr. et al. . |
| 5,193,175 | 3/1993 | Cutts, Jr. et al. .................... 395/575 |
| 5,216,635 | 6/1993 | Kass et al. ............................ 365/222 |

Primary Examiner—Robert W. Beausoliel, Jr.
Assistant Examiner—Alan M. Fisch
Attorney, Agent, or Firm—Graham & James

[57] ABSTRACT

A fault tolerant computer system having a plurality of processor modules having independent clocks for processing an instruction stream, global memory accessible by all of the processor modules, and a local memory configured within each processor module and clocked synchronously therewith. The local memory is periodically refreshed between accesses to the local memory by the processor. Warning signals indicating a potential access to the local memory are provided to a refresh controller and the local memory is refreshed or the refresh is aborted depending upon the number of clock cycles available before a local memory access occurs. A speculative refresh may be stalled until a processor instruction is decoded to determine whether a local memory access is requested or not.

19 Claims, 17 Drawing Sheets

FIG. 16

| | $t_0$ | $t_1$ | $t_2$ | $t_3$ | $t_4$ | $t_5$ | $t_6$ | $t_7$ | $t_8$ | $t_9$ | $t_{10}$ | $t_{11}$ | $t_{12}$ |
|---|---|---|---|---|---|---|---|---|---|---|---|---|---|
| CPU A | 0 ← EX_IRQ | 1 | 2 | 3 | 4 | 5 | 6 | 7 | 8 | 9 | 10 | 11 | 12 |
| CPU B | 2 | 3 | 4 | 5 | 6 | 7 | 8 | 9 | 10 | 11 | 12 | 13 | 14 |
| CPU C | 3 | 4 | 5 | 6 | 7 | 8 | 9 | 10 | 11 | 12 | 13 | 14 | 15 |
| IRQ_A_PENDING | 0 | 0 | 0 | 0 | 1 | 1 | 1 | 1 | 1 | 1 | 1 | 1 | 1 |
| IRQ_B_PENDING | 0 | 0 | 1 | 1 | 1 | 1 | 1 | 1 | 1 | 1 | 1 | 1 | 1 |
| IRQ_C_PENDING | 0 | 1 | 1 | 1 | 1 | 1 | 1 | 1 | 1 | 1 | 1 | 1 | 1 |
| IRQ_A | 0 | 0 | 0 | 0 | 0 | 0 | 0 | 0 | 1 | 1 | 1 | 1 | 1 |
| IRQ_B | 0 | 0 | 0 | 0 | 0 | 0 | 1 | 1 | 1 | 1 | 1 | 1 | 1 |
| IRQ_C | 0 | 0 | 0 | 0 | 0 | 1 | 1 | 1 | 1 | 1 | 1 | 1 | 1 |

FIG. 17

| | t0 | t1 | t2 | t3 | t4 | t5 | t6 | t7 | t8 | t9 | t10 | t11 | t12 | t13 | t14 | t15 |
|---|---|---|---|---|---|---|---|---|---|---|---|---|---|---|---|---|
| CPU A | 0 | 1 | 2 | 3 | 4 | 5 | 6 | 7 | 0 | 1 | 2 | 3 | 4 | 5 | 6 | 7 |
| CPU B | 2 | 3 | 4 | 5 | 6 | 7 | 0 | 1 | 2 | 3 | 4 | 5 | 6 | 7 | 0 | 1 |
| CPU C | 3 | 4 | 5 | 6 | 7 | 0 | 1 | 2 | 3 | 4 | 5 | 6 | 7 | 0 | 1 | 2 |
| EX_IRQ | 0 | 0 | 0 | 0 | 1 | 1 | 1 | 1 | 1 | 1 | 1 | 1 | 1 | 1 | 1 | 1 |
| IRQ_A_PENDING | 0 | 0 | 0 | 0 | 1 | 1 | 1 | 1 | 1 | 1 | 1 | 1 | 1 | 1 | 1 | 1 |
| IRQ_B_PENDING | 0 | 0 | 0 | 0 | 0 | 0 | 0 | 0 | 0 | 0 | 1 | 1 | 1 | 1 | 1 | 1 |
| IRQ_C_PENDING | 0 | 0 | 0 | 0 | 0 | 0 | 0 | 0 | 0 | 1 | 1 | 1 | 1 | 1 | 1 | 1 |
| IRQ_A | 0 | 0 | 0 | 0 | 0 | 0 | 0 | 0 | 0 | 0 | 0 | 0 | 0 | 0 | 0 | 1 |
| IRQ_B | 0 | 0 | 0 | 0 | 0 | 0 | 0 | 0 | 0 | 0 | 0 | 0 | 0 | 0 | 1 | 1 |
| IRQ_C | 0 | 0 | 0 | 0 | 0 | 0 | 0 | 0 | 0 | 0 | 0 | 0 | 1 | 1 | 1 | 1 |

EX_IRQ →

FAULT-TOLERANT COMPUTER SYSTEM WITH HIDDEN LOCAL MEMORY REFRESH

BACKGROUND OF THE INVENTION

1. Field of the Invention

The present invention relates to computer systems. More particularly, the present invention relates to fault-tolerant computer systems using multiple CPUs.

2. Background Information

Highly reliable digital processing is of critical importance in a number of applications ranging from industrial process control to aerospace, and other applications involving human safety, to banking and financial services. Increased reliability has been achieved in various computer architectures by employing redundancy. For example, triple modular redundancy (TMR) systems provide high reliability by employing three Central Processor Units (CPUs) executing the same instruction stream, with the respective CPU outputs being cross-checked by "voting" hardware or software.

In such TMR systems, voting circuitry or software typically compares the input/output (I/O) requests from each CPU. For example, when the CPUs request access to a memory which is external to the CPUs, i.e., clocked separately from the local CPU clocks, voting may be performed. Also, in general, whenever CPUs need to access devices clocked separately therefrom, synchronization is necessary in order to allow CPU output comparison and thus to ensure fault tolerance. Such synchronization and voting operations, while important in providing a high degree of fault tolerance to the overall system, have a significant impact on the system performance. Thus, the more frequently a fault tolerant computer system has to access external devices, such as external memory, and perform synchronization and voting operations, the slower the overall performance of the system.

The frequency of access by CPUs to an external memory in a fault tolerant computer system may be reduced by employing a local memory for each CPU which is synchronous to its local CPU. Such local memory may store the operating system kernel as well as some of the most frequently accessed data, thereby reducing the number of occasions where the CPU must access external memory and undergo voting and synchronization operations. To provide the desired combination of memory capacity, cost and speed, a dynamic random access memory (DRAM) is preferably employed for such local memory.

A problem is introduced by the use of DRAMs for local memories, however, due to the requirement that such dynamic memories must be periodically refreshed. That is, currently conventional DRAM designs require a periodic refresh of the charge held in their memory cells to prevent loss of data through charge leakage. The frequency of refresh is specified for any given commercially available DRAM design and requires a certain number of refresh cycles in a predetermined period of time, usually measured in milliseconds. The specific timing of the refresh for any given DRAM is not predetermined, however, as long as the required number of refreshes always occur in the predetermined interval of time. The refreshes are typically triggered by a refresh timer which issues refresh requests sufficiently frequently to ensure that the DRAM specifications for refreshes are met.

Refresh requests based on a fixed refresh timer thus could introduce refreshes in a manner which is asynchronous between independently clocked CPUs in a fault tolerant computer system. Such asychronous refreshes can introduce divergences between the CPUs in a multiple CPU fault tolerant system. Additional hardware and/or software is required to take into account these asynchronous refreshes between the CPUs to prevent possible errors when I/O requests from the CPUs are voted.

In addition to the problem of possible divergence between CPUs due to asynchronous local memory refreshes in each CPU, the refreshes have a negative impact on system performance. In particular, refresh of local memory may use 1% to 3% of all possible memory cycles. This results in a reduction in system speed since the local processor must stall waiting for the refresh to complete when a local memory access is requested during a refresh cycle. Additionally, since the number of refresh cycles may differ between CPUs and the number of stall cycles for the processor in the respective CPUs may thus also differ, the local memory refreshes may increase the rate at which the CPUs drift out of real time synchronization. This in turn may require more frequent synchronization of the CPUs thereby offsetting the gains provided by the local memory in reduction of voting and synchronization frequency.

Accordingly, it will be appreciated that a need presently exists for a high speed fault tolerant computer system which has reduced need for synchronization and/or voting operations. More particularly, it will be appreciated that a need presently exists for a fault tolerant computer system which can exploit the use of a local memory in each CPU module to a maximum degree relative to speed and synchronization overhead.

SUMMARY OF THE INVENTION

The present invention provides a fault tolerant computer system of the type employing multiple processors processing an instruction stream. Each processor accesses a local memory clocked synchronously with the processor as well as an external memory which may be clocked asynchronously. The local memory is preferably of a dynamic type which requires periodic refreshes to maintain data integrity. In accordance with the present invention, these refreshes are controlled so as to be hidden from the processor. Hiding of the local memory refreshes is achieved by timing the refreshes so as to only occur when a processor local memory access is not imminent. In this way, simultaneous refreshes of the local memory and access requests from the processor are avoided thereby avoiding processor stalls due to local memory refreshes.

It will be appreciated that the hiding of the local memory refreshes from the processor allows synchronization and voting circuitry in the fault tolerant computer system to ignore local memory refresh activities. This in turn provides a concomitant reduction in circuit complexity and cost. Additionally, since processor stalls due to local memory refreshes during processor access are avoided, an increase in overall computer system speed is provided.

In a preferred embodiment, the present invention employs a local memory controller which receives refresh requests from a refresh timer as well as first, second and third warning signals indicating successively more imminent processor accesses to the local memory. These warning signals may preferably correspond to successively greater degrees of decoding of a processor command. For example, the first warning signal, providing the greatest advanced warning of a possible local memory access, may be a command strobe provided directly from the processor to the local memory controller without any decoding. This signal is a multipurpose strobe which may thus indicate any one of a number of possible processor commands, only one of which is a request for local memory access. The lack of decoding, however, provides several cycles of advance warning to the local memory controller.

The second warning signal in turn is presented after the command instruction is partially decoded and it is determined that a processor request of some type has been presented. This partial decode of the instruction will require at least one clock cycle longer than the initial strobe indicating that a processor command has been presented. Finally, when the instruction is completely decoded, and if it is determined that local memory access has been requested by the processor, a third warning signal is presented. This will typically require an additional clock cycle to complete the decoding of the processor instruction.

It will thus be appreciated that the combination of three levels of warning signals to the local memory controller provides sufficient warning of a local memory access request by the processor to either allow the local memory controller to complete a refresh or abort a refresh without interfering with the processor access to the memory.

More specifically, in a preferred embodiment, the first warning signal is employed by the local memory controller to delay a refresh, which has been requested by the refresh timer, one clock cycle. This first warning signal is ignored unless the memory controller is about to commit the refresh. Even then, the logic will preferably only allow this signal to delay refresh for one cycle. Otherwise, this multi-purpose strobe could potentially lock out refresh because of operations not concerning local memory. If the second warning signal is received within the one clock cycle delay the local memory refresh is delayed an additional clock cycle. However, if the second warning signal is not received within the one clock cycle delay of the refresh, then the local memory controller proceeds with the refresh, since the strobe corresponding to the first warning signal was not decoded to be a read/write request. Finally, if the third warning signal is received within the second delay period, the local memory controller aborts the refresh since an access of the local memory by the processor is imminent.

Accordingly, it will be appreciated that the present invention provides a fault tolerant computing system which can fully exploit the advantages of a synchronously clocked local memory in each of multiple processor modules, without requiring additional synchronization or voting hardware to compensate for local memory refresh requirements. It will further be appreciated that the present invention provides a dynamic memory refresh control technique which may be advantageously exploited in fault tolerant computer systems as well as in non-fault tolerant single processor systems employing dynamic memories, due to a reduction in processor stall cycles.

BRIEF DESCRIPTION OF THE DRAWINGS

FIGS. 16, 17, 18 and 19 are timing diagrams showing events vs. time for execution of instructions in the CPUs of FIGS. 1 and 2 when an interrupt occurs.

DETAILED DESCRIPTION OF THE INVENTION

Figure 1:
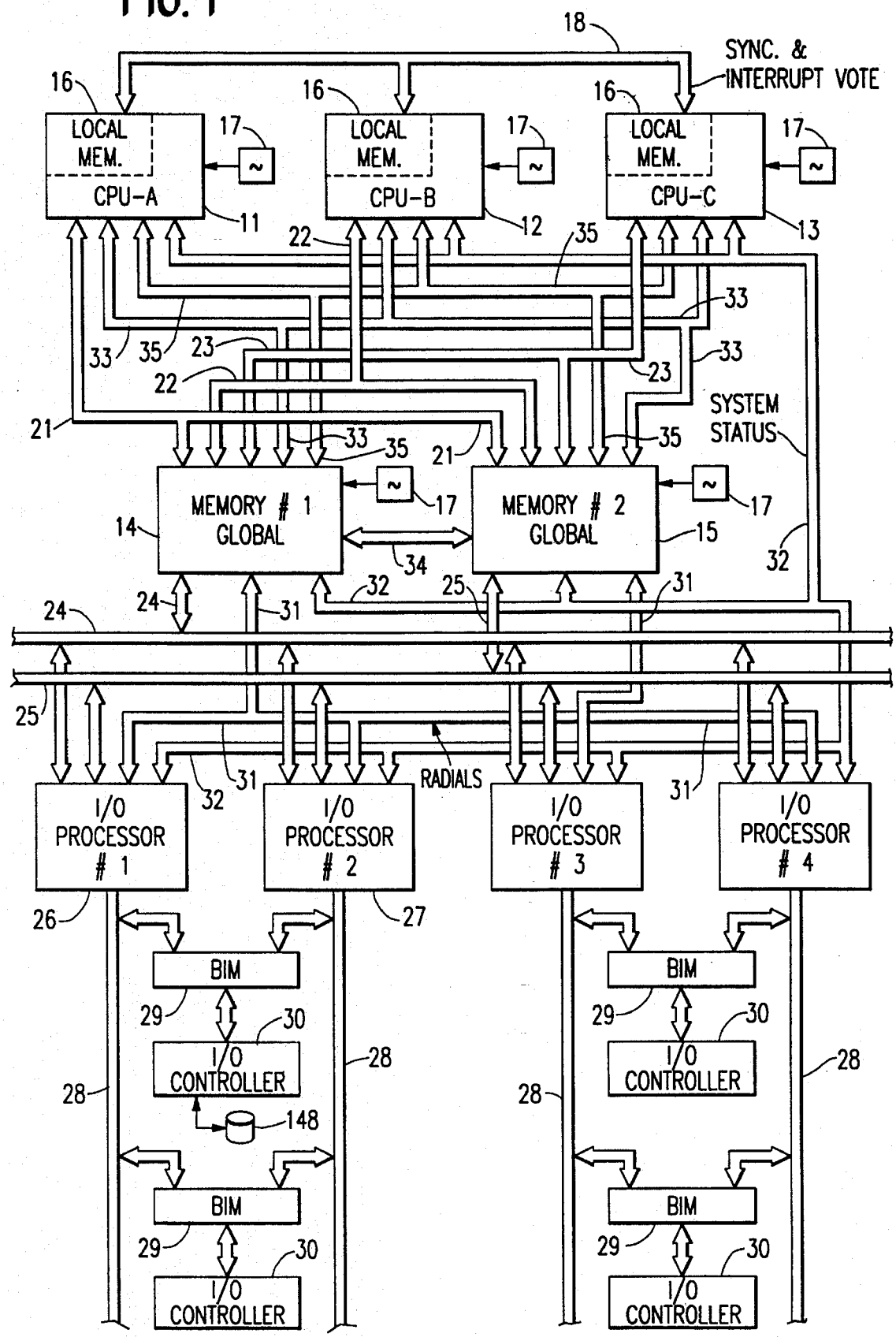
FIG. 1 is an electrical schematic drawing in block form of a computer system according to one embodiment of the invention.

With reference to FIG. 1, a fault tolerant computer system in accordance with the present invention is shown in one embodiment. As illustrated, the computer system employs three Central Processor modules or Units (CPUs) 11, 12 and 13, referred to as CPU-A, CPU-B and CPU-C, which operate as one logical processor. Although three CPUs are illustrated, corresponding to a minimal TMR voting system, it should be appreciated that two CPUs, or more than three CPUs, could also be employed while providing varying degrees of fault tolerance. Each of the CPUs preferably executes the same instruction stream while processing applications software. The only time the three CPUs are not executing the same instruction stream is in such operations as power-up self test, diagnostics and the like.

The three CPUs are coupled to two memory modules 14 and 15, referred to as Memory-#1 and Memory-#2, each memory storing the same data in the same address space. In a preferred embodiment, each one of the processors 11, 12 and 13 contains its own local memory 16, as well, accessible only by the processor containing this memory.

Each one of the CPUs 11, 12 and 13, as well as each one of the memory modules 14 and 15, has its own separate clock oscillator 17, thus, the CPUs are not run in "lock step" under a single clock, and instead are "loosely coupled" and synchronized, as described in detail below. External interrupts are synchronized among the three CPUs by a technique employing a set of busses 18 for coupling the interrupt requests and status from each of the CPUs to the other two; each one of the CPUs CPU-A, CPU-B and CPU-C is responsive to the three interrupt requests, its own and the two received from the other CPUs, to present an interrupt to the CPUs at the same clock cycle.

CPU-A 11 is connected to Memory-#1 module 14 and to Memory-#2 module 15 by a bus 21; likewise CPU-B is connected to memory modules 14 and 15 by a bus 22, and CPU-C is connected to memory modules 14 and 15 by a bus 23. These busses 21, 22, 23 each include a multiplexed address/data bus, a command bus, and control lines for address and data strobes. The respective CPUs have individual control of these busses 21, 22 and 23, so there is no arbitration, or bus-request and bus-grant.

Each one of the memory modules 14 and 15 is separately coupled to respective input/output bus 24 or 25, and each of these busses is coupled to two (or more) input/output processors 26 and 27. The system can have multiple I/O processors as needed to accommodate the I/O devices needed for the particular system configuration. Each one of the input/out processors 26 and 27 is connected to a bus 28, which may be of a standard configuration such as a VMEbus™, and each bus 28 is connected to one or more bus interface modules 29 for interface with a standard I/O controller 30. Each bus interface module 29 is connected to two of the busses 28, so failure of one I/O processor 26 or 27, or failure of one of the bus channels 28, can be tolerated. The I/O processors 26 and 27 can be addressed by the CPUs 11, 12 and 13 through the memory modules 14 and 15, and can signal an interrupt to the CPUs via the memory modules. Disk drives, terminals with CRT screens and keyboards, and network adapters, are typical peripheral devices operated by the controllers 30. The controllers 30 may make DMA-type references to the memory modules 14 and 15 to transfer blocks of data. Each one of the I/O processors 26, 27, etc., has certain individual lines directly connected to each one of the memory modules for bus request, bus grant, etc; these point-to-point connections are called "radials" and are included in a group of radial lines 31.

It will be appreciated from the architecture of FIG. 1 that all external CPU operations, i.e., operations to a module or device separately clocked from the CPU and thus asynchronous thereto, which operations are also generally referred to herein as I/O operations, occur through memory modules 14 and 15. These memory modules in turn vote the I/O requests by the CPUs. It should be appreciated, however, that other architectures may equally be employed where CPU I/O requests proceed to external devices directly without first passing through a memory global to all CPUs. Such CPU I/O requests will nonetheless be voted by appropriate voting circuitry.

A system status bus 32 is individually connected to each one of the CPUs 11, 12 and 13, to each memory module 13 and 15, and to each element. This status bus provides information about which of the CPUs, memory modules and I/O processors is currently in the system and operating properly.

An acknowledge/status bus 33 connecting the three CPUs and two memory modules includes individual lines by which the modules 14 and 15 send acknowledge signals to the CPUs when I/O requests are made by the CPUs, and voted by the memory modules. At the same time a status field is sent to report on the status of the command and whether it executed correctly. The memory modules not only check parity on data read from or written to the global memory, but also check parity on data passing through the memory modules to or from the I/O busses 24 and 25, as well as checking the validity of commands. It is through the status lines in bus 33 that these checks are reported to the CPUs 11, 12 and 13, so if errors occur a fault routine can be entered to isolate a faulty component. A fault recovery routine including reintegration of a faulty component is illustrated in U.S. patent application Ser. No. 07/461,250 to Douglas E. Jewett et al., filed Jan. 5, 1990, which application is assigned to the assignee of the present application, the disclosure of which is incorporated herein by reference.

Even though both memory modules 14 and 15 are storing the same data in global memory, and operating to perform every memory reference in duplicate, one of these memory modules is designated as primary and the other as back-up, at any given time. To keep the primary and back-up modules executing the same operations, a bus 34 conveys control information from primary to back-up. Either module can assume the role of primary at boot-up, and the roles can switch during operation under software control; the roles can also switch when selected error conditions are detected by the CPUs or other error-responsive parts of the system.

Certain interrupts generated in the CPUs are also voted by the memory modules 14 and 15. When the CPUs encounter such an interrupt condition (and are not stalled), they signal an interrupt request to the memory modules by individual lines in an interrupt bus 35, so the three interrupt requests from the three CPUs can be voted. When all interrupts have been voted, the memory modules each send a voted-interrupt signal to the three CPUs via bus 35. This voting of interrupts also functions to check on the operation of the CPUs. The three CPUs synchronize the voted interrupt CPU interrupt signal via the inter-CPU bus 18 and present the interrupt to the processors at a common clock cycle in the respective CPUs. This interrupt synchronization is accomplished without stalling any of the CPUs.

Further details on the voting provided by memory modules 14 and 15 and on the I/O processors 26, 27 are provided in U.S. Pat. No. 5,146,589 issued Sep. 8, 1992 to Charles E. Peet, Jr. et al., assigned to the assignee of the present application, the disclosure of which is incorporated herein by reference.

Figure 2:
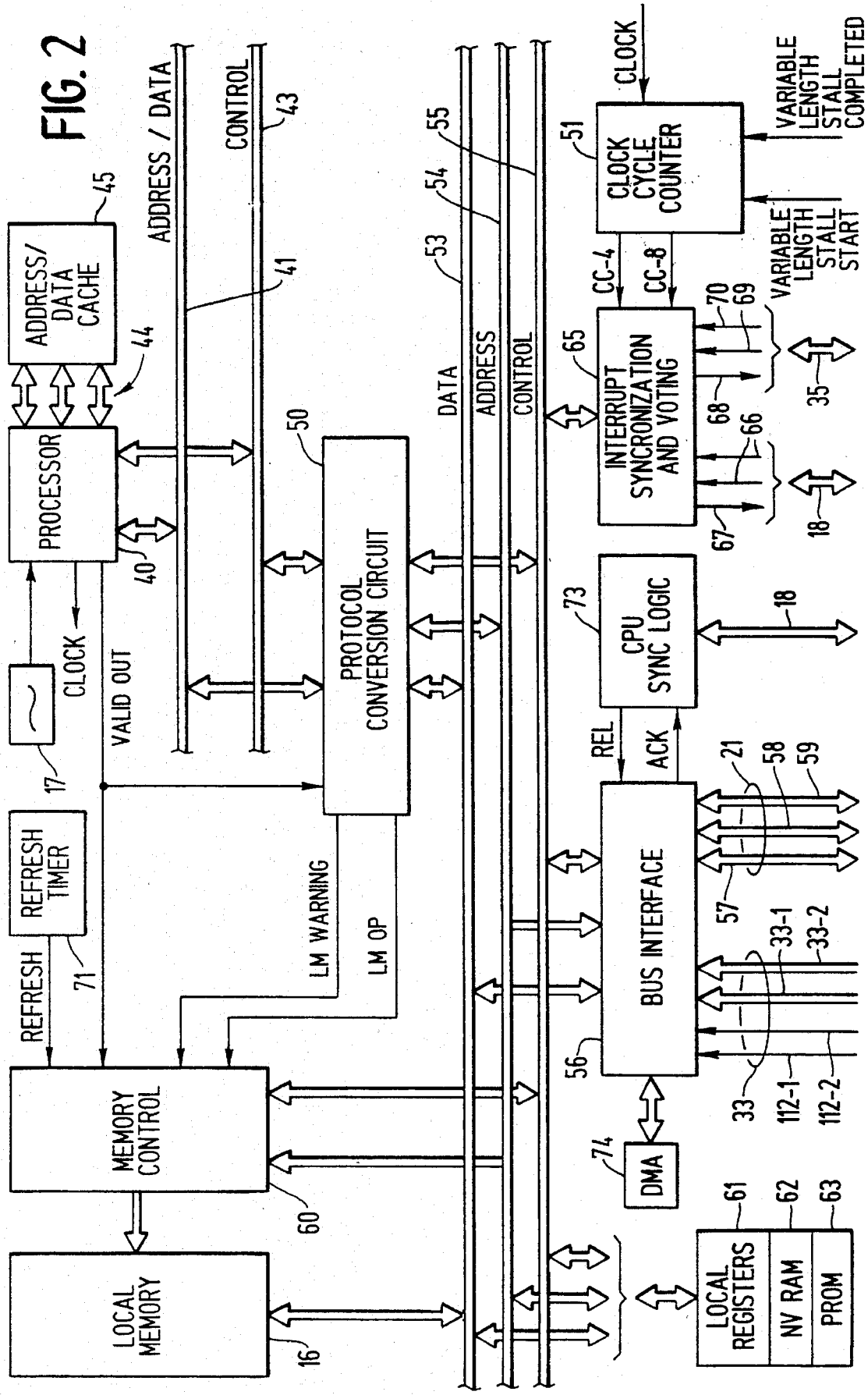
FIG. 2 is an electrical schematic drawing in block form of one of the CPUs of the system of FIG. 1.

CPU Modules:

Referring now to FIG. 2, one of the CPU modules 11, 12 or 13 is shown in more detail. All three CPU modules are of the same construction in a preferred embodiment, so only CPU-A will be described here. In order to keep costs within a competitive range, and to provide ready access to already-developed software and operating systems, it is preferred to use a commercially-available microprocessor chip, and any one of a number of devices may be chosen. The RISC (reduced instruction set) architecture has some performance advantages, but more-conventional CISC (complex instruction set) microprocessors such as Motorola 68030 devices or Intel 80386 or 80486 devices could be used. High-speed RISC microprocessor devices are available from several sources; for example, Motorola, MIPS Computer Systems, Inc., Sun Microsystems, Cypress Semiconductor all produce high performance RISC microprocessors of various designs.

The CPU board or module in the illustrative embodiment, used as an example, employs a microprocessor 40 which is, in a preferred embodiment an R4000 device designed by MIPS Computer Systems, Inc. The R4000 device is a 64-bit processor using RISC architecture to provide high performance at a 100-MHz clock rate. This internal clock rate is obtained by the processor 40 receiving local oscillator 17 at, e.g., 50 MHz and multiplying it to create a 100 MHz clock used internally and dividing it to provide a lower speed clock signal, e.g., 25 MHz, which is used for clocking the remainder of the CPU module. It should be appreciated that higher clock speeds and other performance increasing features of this processor may advantageously be employed as such features become available. Other versions of this device may also be used, such as the R3000 that provides a cost savings at reduction of speed. The processor 40 also has internal integer and floating point co-processors and an internal cache (not shown). It should be appreciated that while a single processor 40 is illustrated for each CPU, more than one processor may be provided, such processors operating in parallel as one logical unit, and further, the synchronization techniques discussed below will be equally suitable for such a multi-processor CPU system.

Figure 3:
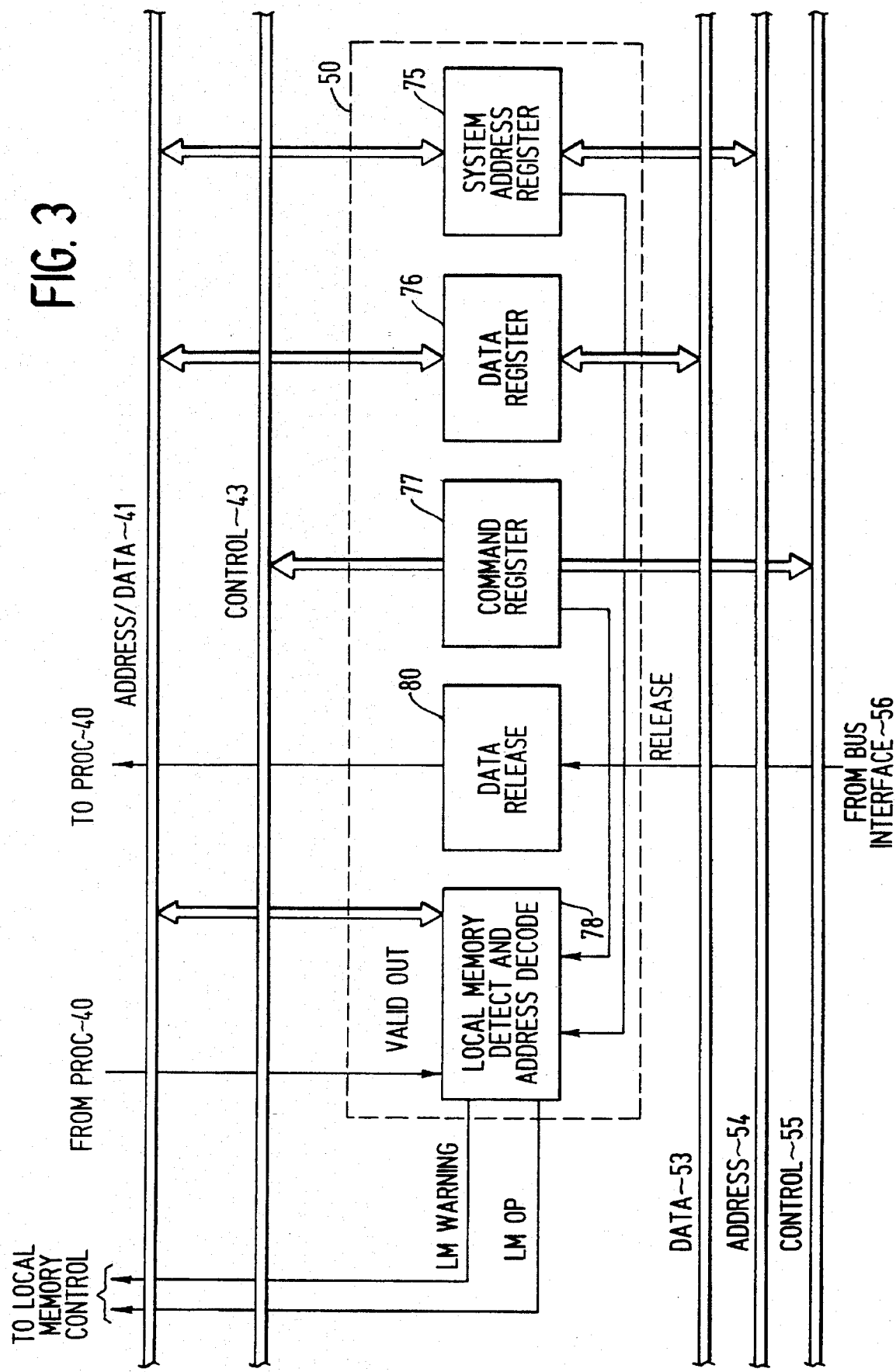
FIG. 3 is an electrical schematic drawing in block form of the protocol conversion circuit employed in the CPU of FIG. 2.

The processor 40 is coupled to a local bus having a multiplexed address/data 41, and a control bus 43. An external cache memory 45 is preferably provided and is coupled to processor 40 via a separate bus 44 having address, data and control paths, indicated-separately. The local bus 41, 43, is coupled to an internal control logic bus (CLB) structure through a protocol conversion circuit 50. More specifically, the protocol conversion circuit 50, described in more detail below in relation to FIG. 3, is coupled to the CLB bus structure having a data bus 53, an address bus 54 and a control bus 55. The local memory 16 is accessed by this internal bus, and a bus interface 56 coupled to the internal bus is used to access the system bus 21 (or bus 22 or 23 for the other CPUs). The separate data and address busses 53 and 54 of the internal bus (as derived from bus 41 from the processor) are converted to a multiplexed address/data bus 57 in the system bus 21, and the command and control lines are correspondingly converted to command lines 58 and control lines 59 in this external bus.

The bus interface unit 56 also receives the acknowledge/status lines 33 from the modules 14 and 15. In these lines 33, separate status lines 33-1 or 33-2 are coupled from each of the modules 14 and 15, so the responses from both memory modules can be evaluated upon the event of a transfer (read or write) between CPUs and global memory, as will be explained.

The local memory 16 is preferably a Dynamic Random Access Memory (DRAM) which can be accessed in about three of the CPU modules' clock cycles (e.g., 25 MHz). This access is synchronous with the clock of this processor 40, which, as noted above, may be 100 MHz in a current embodiment. The local memory 16 is accessed by a memory controller 60 which receives the addresses from address bus 54, and the address strobes from the control bus 55, and generates separate row address signals (RAS) and column address signals (CAS), for example, if the local memory 16 employs DRAMs with multiplexed addressing, as is usually the case. Data is written to or read from the local memory via data bus 53. Additionally, local memory 16, in accordance with DRAM requirements needs periodic refresh. A refresh timer 71 provides a refresh request signal to memory controller 60 which controls such refresh operations, as discussed in more detail below.

In addition, several local registers 61, as well as non-volatile memory 62 such as NVRAMs, and high-speed PROMs 63, as may be used by the operating system, are accessed by the internal bus; some of this part of the memory is used only at power-on, some is used by the operating system and may be almost continuously within the internal cache or cache 45, and other may be within the non-cached part of the memory map.

External interrupts are applied to the processor 40 by the protocol conversion circuit 50 from an interrupt circuit 65 in the CPU module of FIG. 2. All interrupts are voted in the circuit 65, so that before an interrupt is executed by the processor 40 it is determined whether or not all three CPUs are presented with the same interrupt; to this end, the circuit 65 receives interrupt pending inputs 66 from the other two CPUs 12 and 13, and sends an interrupt pending signal to the other two CPUs via line 67, these lines being part of the bus 18 connecting the three CPUs 11, 12 and 13 together. Also, for voting other types of interrupts, specifically CPU-generated interrupts, the circuit 65 can send an interrupt request from this CPU to both of the memory modules 14 and 15 by line 68 in the bus 35, then receive separate voted-interrupt signals from the memory modules via lines 69 and 70; both memory modules will present the external interrupt to be acted upon. An interrupt generated in some external source such as a keyboard or disk drive on one of the I/O channels 28, for example, will not be presented to the processor 40 from the circuit 65 until each one of the CPUs 11, 12 and 13 is at the same clock cycle as will be explained below.

As further shown in FIG. 2, the interrupt circuit 65 receives clock counter outputs CC-4 and CC-8 from clock cycle counter 51. Counter 51 counts clock signals and outputs count values which are employed for external interrupt synchronization as discussed in detail below in relation to FIGS. 15–19. As indicated by inputs to the counter, the counter 51 is enabled upon receipt of a release signal following completion of a clock drift removal procedure described below and is disabled upon receipt a drift removal register read start signal. Thus, counter 51 is enabled and counts clock cycles during all CPU operations other than during the clock drift removal procedure discussed below.

As further shown in FIG. 2, the CPU module includes CPU synchronization logic circuitry 73. This synchronization logic is coupled to the other CPUs via inter-CPU bus 18. Also, the acknowledge signal provided by the memory modules to bus interface 56 is routed to sync logic 73 instead of directly to processor 40. The sync logic 73 in turn provides a release signal to bus interface 56 for presentation to processor 40. Sync logic 73 is described in more detail below in relation to FIGS. 4, 5 and 6.

The processor 40 has a RISC instruction set which does not support memory-to-memory instructions, but instead only memory-to-register or register-to-memory instruction (i.e., load or store). It is important to keep frequently-used data and the currently-executing code in local memory or cache. Accordingly, a block-transfer operation is provided by a DMA state machine 74 coupled to the bus interface 56. The processor 40 writes a word to a register in the DMA circuit 74 to function as a command, and writes the starting address and length of the block to registers in this circuit 74. In one embodiment, the microprocessor stalls while the DMA circuit takes over and executes the block transfer, producing the necessary addresses, command and strobes on the busses 53–55 and 21. The command executed by the processor 40 to initiate this block transfer can be a read from a register in the DMA circuit 74. Since memory management in the Unix operating system relies upon demand paging, these block transfers will most often be pages being moved between global and local memory and I/O traffic. While the busses 21, 22 and 23 support single-word read and write transfers between CPUs and global memory; the block transfers referred to are only possible between local and global memory.

Referring to FIG. 3, the protocol conversion circuit 50 is illustrated in a block schematic drawing. The protocol conversion circuit 50 translates the multiplexed address/data and command protocol between the address/data and control busses 41 and 43, which directly communicate with the processor 40 with the data, address and control busses 53, 54 and 55 of the CLB which communicates with the bus interface 56 and interrupt synchronization and voting circuitry 65. Although the respective busses 41 and 43 and 53–55 may preferably both be 64 bit wide busses, they may alternatively be of different data widths; for example, 64 bit wide and 32 bit wide respectively. Also, while both busses may be preferably clocked at the maximum CPU module rate, a divided down clock rate may be employed for busses 53–55. Therefore, protocol conversion circuit 50 may provide address and data decoding between different bit widths of the respective busses as well as data rate compensation for block mode accesses of global memory.

More specifically, as shown in FIG. 3, protocol conversion circuit 50 employs system address register 75 for address bus protocol conversion and data register 76 for the data bus protocol conversion and data rate buffering. Command register 77 in turn provides protocol conversion and buffering for commands provided on control busses 43 and 55. System address register 75 and command register 77 also detect writes to local memory which may invalidate the data stored in cache memory and instruct processor 40 to invalidate external cache 45 (shown in FIG. 2) and the processor 40 internal cache.

As further illustrated in FIG. 3, the protocol conversion circuit 50 also preferably includes a local memory detect and address decode circuit 78 which is coupled to the processor address/data bus 41. Local memory decode circuit 78 receives memory requests from the processor 40 via system address register 75 and command register 77. Prior to full decoding of the request, circuit 78 first issues a first warning signal, "LM WARNING" to the local memory control circuit 60 indicating a possible local memory access request by processor 40. After the processor memory request is decoded by address decode circuit 78, and if a local memory access request is determined, the address decode circuit 78 issues a second warning signal in the form of local memory operation signal, "LM OP", to local memory controller 60 as illustrated in FIG. 3. As will be discussed in more detail below in relation to FIGS. 12, 13 and 14, these first and second warning signals, LM WARNING and LM OP, are employed by memory controller 60 to control the timing of the local memory refresh of the dynamic random access memory 16, so as to hide the refresh operations from processor 40.

As further shown in FIG. 3, the protocol conversion circuit 50 also includes a data release circuit 80. Data release circuit 80 provides a strobe signal to processor 40 in response to a release signal from bus interface circuit 56, after a data read operation from global memory or an I/O device after completion of a synchronization procedure between the respective CPUs, as will be discussed in more detail below. This same release signal is also provided after every read of local memory or any register on the CPU board. This includes a read of the drift removal start register.

Figure 4:
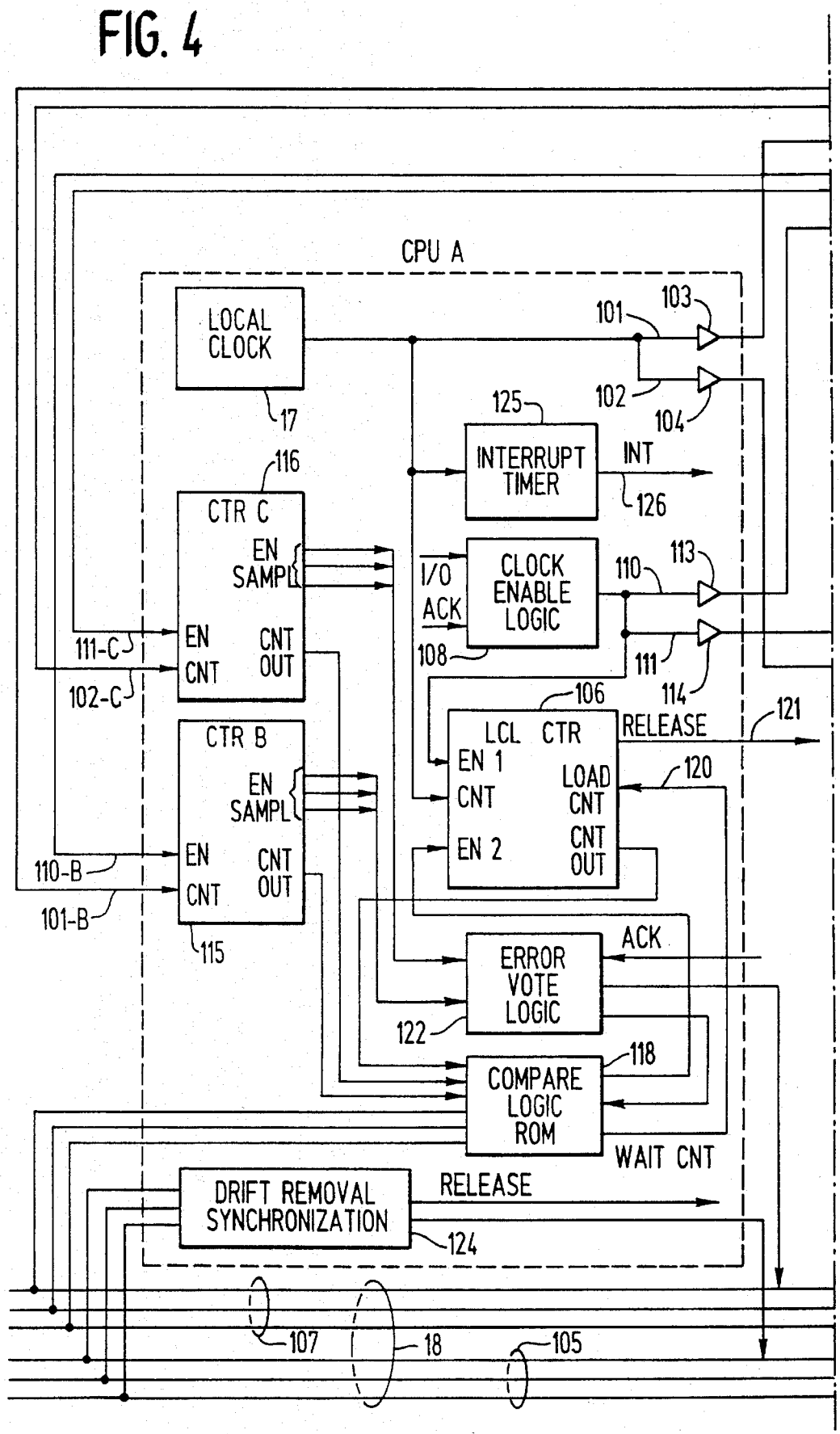
FIGS. 4, 5 and 6 are electrical schematic drawings of the CPU synchronization logic employed in the system of FIGS. 1 and 2.
Figure 5:
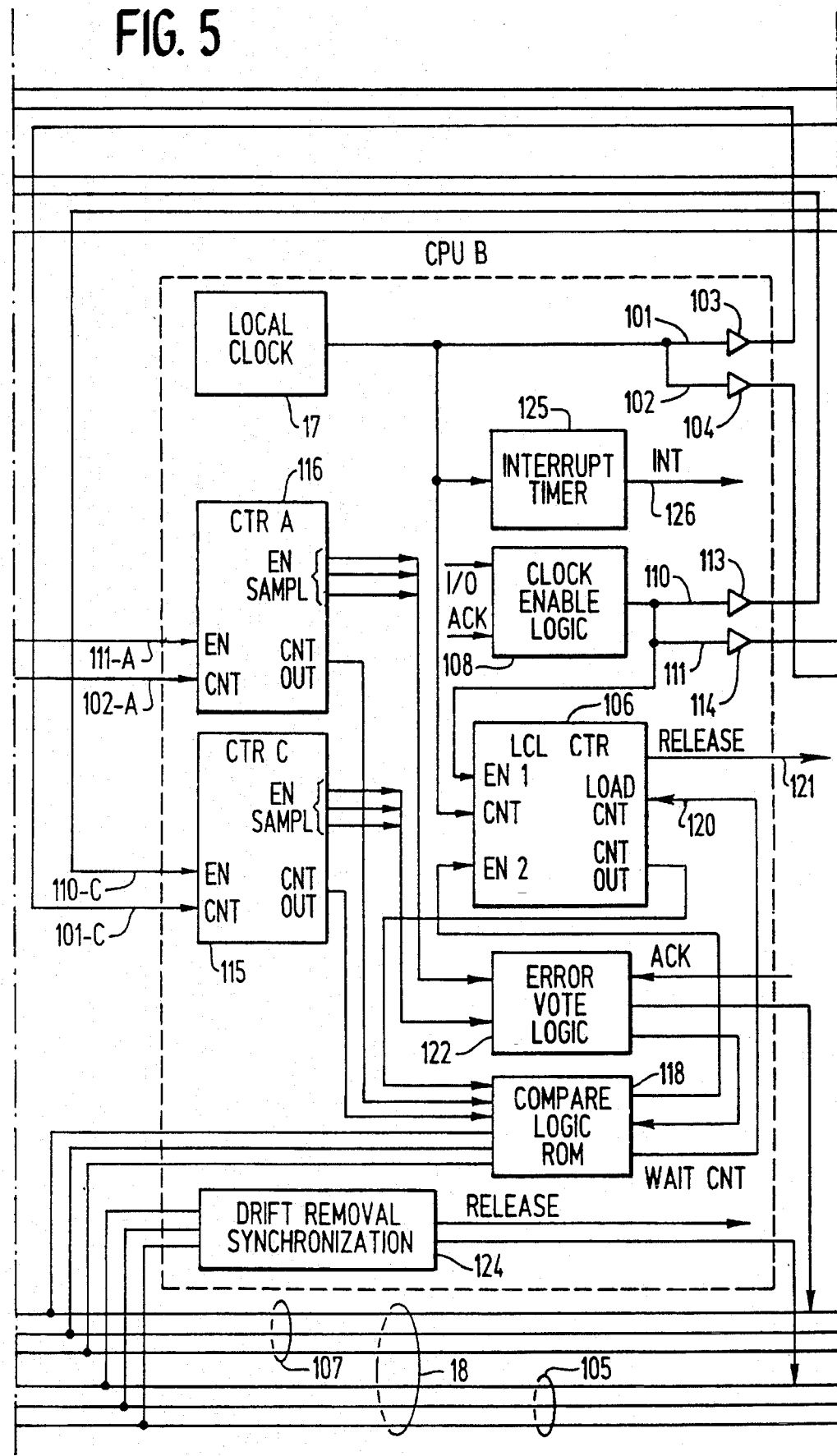
Figure 6:
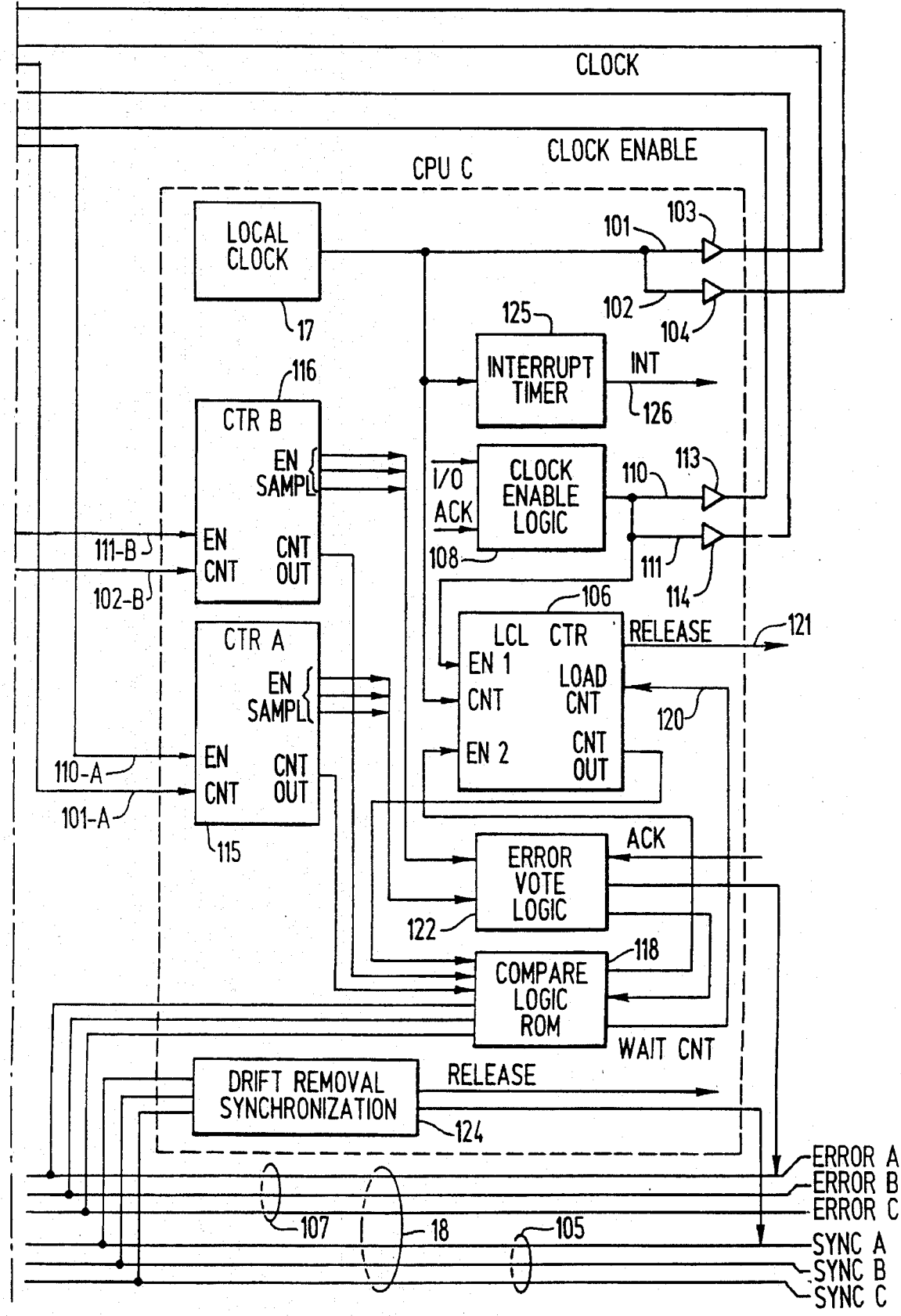

CPU Synchronization:

Referring to FIGS. 4, 5 and 6 a preferred embodiment of the CPU synchronization logic 73 is illustrated in block schematic drawings. The synchronization logic for each of the three CPUs, CPU-A, CPU-B and CPU-C, is shown separately in FIGS. 4, 5 and 6, respectively, to more clearly illustrate the interconnection of the various components between the respective CPUs. Since the synchronization circuitry is identical for each CPU, however, like numerals will be employed for matching components in the circuits for each of the CPUs with an "A" "B" or "C" after the numeral designating to which CPU the component relates, where necessary for clarity.

Referring to FIGS. 4, 5 and 6 the synchronization logic 73 for each CPU receives the local clock signal of that CPU and distributes it to the other CPUs along lines 101 and 102. Each of lines 101 and 102 distributing these clock signals to the other CPUs preferably has its own driver, 103, 104, respectively, to provide a degree of fault tolerance. That is, even if one of the drivers 103 or 104, or the line to which it is connected, becomes shorted or is faulty, the other line will still correctly route the local clock signal to the other processor thereby allowing operation of the computer system with two processors.

As further shown in FIGS. 4, 5 and 6 each CPU also provides its local clock signal 17 to a local counter 106. Local counter 106 counts the local clock cycles 17 when enabled by clock enable logic 108. The clock enable logic 108 receives an I/O request signal from the local processor 40 signaling the beginning of an I/O operation. Clock enable logic 108 then sends out an enable signal to the local counter 106 to start the local counter counting local clock pulses. Clock enable logic 108 also sends the enable signal to the other CPUs, along lines 110 and 111, respectively, employing independent fault tolerant drivers 113, 114, respectively.

Each CPU's synchronization logic 73 also includes second and third counters 115, 116, respectively, for receiving the clock and clock enable signals from the other two CPUs. Thus, for example, counter 115 configured in CPU-A receives the clock signal from CPU-B along line 101-B and a counter enable signal from CPU-B along line 110-B. Second counter 116 configured in CPU-A in turn receives the clock signal and a clock enable signal provided from CPU-C along lines 102-C and 111-C, respectively.

Thus, CPU-A employs synchronization logic having local counter 106 counting its local clock cycles 17, counter 115 counting clock cycles from CPU-B and counter 116 counting clock cycles from CPU-C. These three counters are used to determine the number of clock cycles taken by each of the CPUs, CPU-A, CPU-B and CPU-C during a given input/output operation. It will thus be appreciated that each of the CPUs employs synchronization logic having three counters (in the preferred embodiment illustrated with three CPUs) counting the local clock of the CPU and the clock signals from the other two CPUs during an I/O operation executed by each of the CPUs.

When the I/O is voted and completed the acknowledge signal (ACK) is presented by the global memory to the bus interface 56 (as shown in FIG. 2). Bus interface 56 routes the acknowledge signal to the CPUs sync logic 73, instead of to the processor 40. The termination of the I/O, is thus signaled simultaneously to each of the CPUs sync logic by the acknowledge signal from the global memory. Then depending on clock alignment and metastability, the sync logic in all the CPUs will typically see this signal within one cycle of each other. This signal ACK is provided to clock enable logic 108 in each CPU's sync logic 73 which de-activates the clock enable it distributes to the other CPUs. With the enable de-activated, the counters will hold their count value and they may safely sample this static count with their own clock. In a preferred embodiment, each CPU's synchronization logic waits two clock cycles after its count enable is turned off and samples the counter, as discussed in more detail below in relation to FIG. 7. It will then wait two more cycles and sample in counter again. The clock enable is sampled for these two clock points and at an intermediate clock, and these three enable samples are sent to error vote logic 122. These enable samples are used by the error vote logic to ascertain the count validity as discussed in more detail below.

The length of the I/O operation in clock cycles for each of the CPUs is then compared by compare logic 118. Compare logic 118 determines which CPU has taken the largest number of clock cycles to execute the I/O operation by comparing the outputs of the three counters 106, 115 and 116. The difference between the largest count and the count of the local counter 106 is then determined by a simple subtraction operation. This difference in clock cycle count between the largest I/O clock cycle count and the local counter count value, the "WAIT COUNT", represents the number of clock cycles the CPU must wait for its I/O operation to have an equal number of clock cycles as the CPU with the highest count. This WAIT COUNT is sent from the compare logic 118 along line 120 to local counter 106. Local counter 106 is loadable and the WAIT COUNT value to local counter 106 is loaded in that counter and at the same time it is enabled to start decrementing the count by one for each clock until zero is reached. After the WAIT COUNT value is decremented by local counter 106, a release signal is provided along line 121 to the local processor 40 via the bus interface circuit 56 and protocol conversion circuit 50, to release the processor to accept the data requested by an input operation. An output operation follows the same steps, but the release signal only frees the interface circuitry. It may be that the processor was stalled waiting for the interface circuitry to be available, but an output operation does not directly stall the processor 40.

In the event that the compare logic 118 determines that the local counter 106 output is the largest count value of the three CPUs, then the WAIT COUNT value is zero and the local counter may immediately issue the release signal along line 121 to bus interface 56 and to processor 40, via protocol conversion circuit 50, to release the processor 40 with the results of the I/O operation.

The compare logic 118 may be readily implemented by placing the possible WAIT COUNT results as outputs of a read only memory (ROM) which receives the count values from counters 106, 115 and 116 as the inputs thereto. To minimize the total number of possibilities, and to minimize the impact on performance, the total drift between the processors in the three CPUs is preferably limited to a predetermined number of clock cycles. For example, it may be limited to plus or minus 32 clock cycles. This limitation on clock drift between the CPUs may be achieved by employing a timer 125 which counts clock cycles and issues an interrupt along line 126 at fixed intervals e.g., every ten (10) milliseconds. As discussed in more detail below, this interrupt initiates a software routine which, in conjunction with drift removal synchronization circuitry 124, removes the accumulated clock drift between CPUs A, B and C.

Additionally, the compare logic 118 may be simplified by employing modular (or wraparound) counters for the counters 106, 115 and 116, and determining whether or not the counters have "wrapped around" relative to each other. For example, if 7 bit modular counters are employed for counters 106, 115 and 116, each counter may count up to 128 counts. If, as noted above, the processor clock cycle drift is maintained to plus or minus 32 clock cycles, the count values from the three counters will cluster within a range of 64 counts. Therefore, if the counter output values of the three counters lie within a 64 count range near the middle of the total 128 count clock range (i.e., not less than 32 counts from either the 0 or 128 count limits of the counter) the comparison may be directly made. However, if the cluster occurs near the top and bottom of the range, then one or more of the counters must have wrapped around. In this case, the compare logic 118 automatically adds 128 to the wrapped around counts (those near 0) before doing the comparison. Thus, compare logic 118 may implement, in one or more ROMs, a wraparound subtractor that directly outputs the subtraction results from counters 106, 115 and 116 and the resultant WAIT COUNT by inputting the counts on the address lines of the ROMs with each combination providing a memory location that contains the precalculated results. Alternatively, a programmable logic device (PLD) may be employed that implements a compact logic function which will choose the largest count and then control the local counter 106 to decrement this value.

As further illustrated in FIGS. 4, 5 and 6, the synchronization logic in each CPU preferably also includes error vote logic 122. The operation of the error vote logic 122 may be appreciated by consideration of a preferred embodiment of counters 115 and 116 implemented in each CPU, as shown in FIG. 7.

Figure 7:
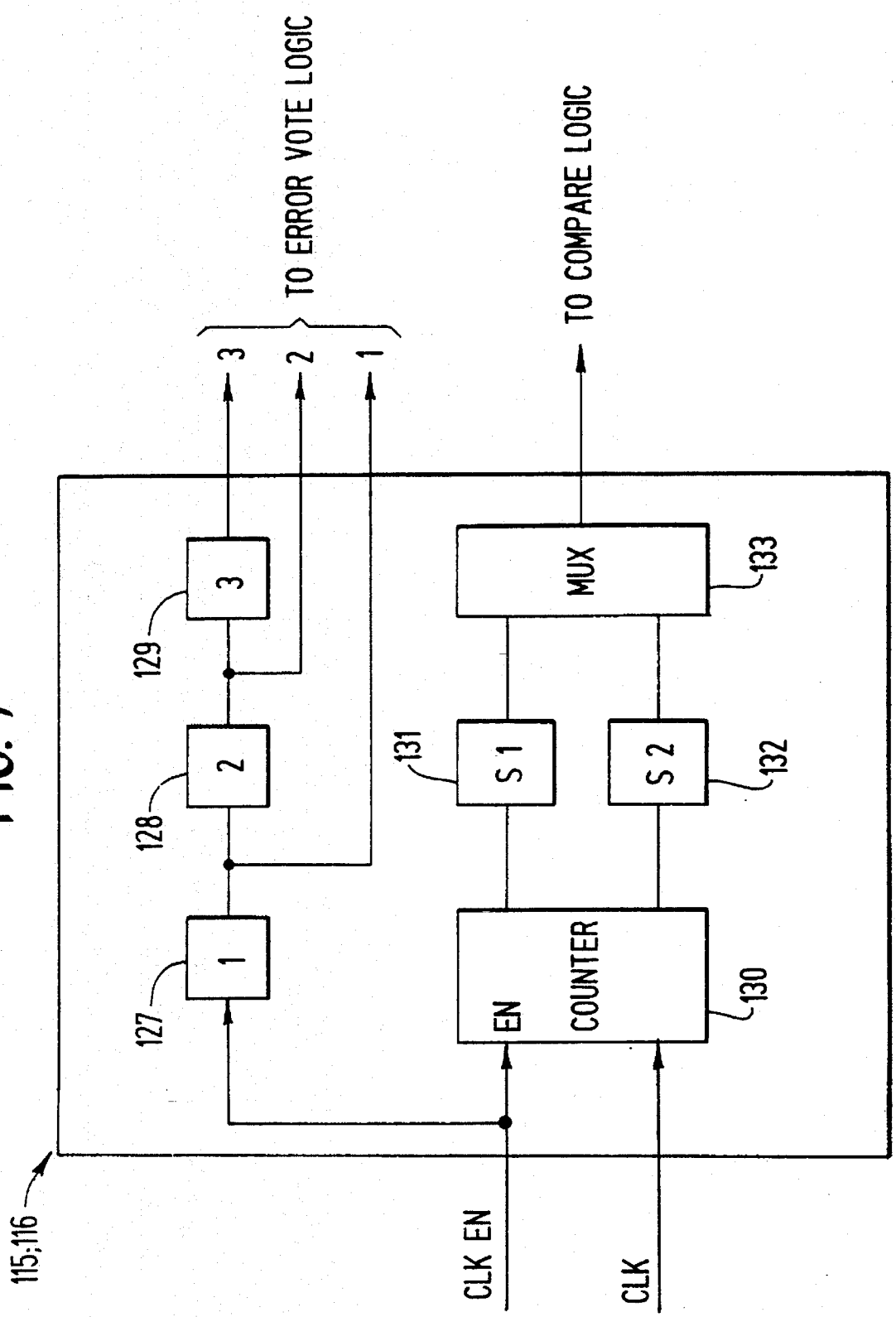
FIG. 7 is an electrical schematic drawing of a clock cycle counter employed in the synchronization circuitry of FIGS. 4, 5 and 6.

As shown in FIG. 7, the counters preferably employ a pipelined structure for receiving the clock enable signal (CLK EN) and providing clock enable samples "1", "2" and "3" at pipeline sample points 127, 128 and 129, respectively. Counters 115 and 116 also each include counter 130. Two separate samples of the counter output, samples S1 and S2 are provided by sampling circuits 131 and 132, respectively, which sample the count value of the counter 130. These samples are then provided as an output to compare logic 118 via multiplexer 133. Thus, each of counters 115 and 116 provides three clock enable samples to the error vote logic 122 and two counter samples to compare logic 118. Which sample is to be used for the WAIT COUNT determination is decided by error vote logic 122 which instructs compare logic 118 accordingly.

The error vote logic circuit 122 in each CPU determines if each of the other two CPUs are sufficiently in synchronization with itself to trust its count value. To ensure fault tolerance, two non-faulty processors should always independently make the same decision and stay in synchronization. The error vote logic 122 uses the three clock enable pipeline samples for error determination as illustrated in FIG. 7.

More specifically, the error vote logic determines that the counter samples are valid if the corresponding clock enable was de-activated during the three cycles bracketing the two counter "snapshots". If the enable was really off, the count value will be stable and both samples will receive a valid count. If for any of the clock enable samples the error vote logic 112 detects the enable signal to be asserted, then the count values are suspect.

There are four possible cases which result from this decision:

TABLE 1

| enable at time1 | enable at time2 | enable at time3 | Decision Results: |
|---|---|---|---|
| 0 | 0 | 0 | Case 1: Both Counter samples are valid; the counter was stable during the entire window. The count will be used in the comparison. |
| 0 | 0 | 1 | Case 2: |
| 0 | 1 | 1 | The first counter sample may be valid, but the second sample definitely is invalid. |
| 1 | 0 | 0 | Case 3: |
| 1 | 1 | 0 | The second counter sample may be valid, but the first sample definitely is invalid. |
| 0 | 1 | 0 | Case 4: |
| 1 | 0 | 1 | Both counter samples are invalid and |
| 1 | 1 | 1 | unusable. Neither count will be used in the comparison. |

The table above shows the eight combinations of the three bit "clock enable" pipeline. The enable is sampled at time 1 and again at time 2 and at time 3. The counter samples are coincident with the first and third samples of the "clock enable" pipeline. But because the "clock enable" signal is used to synchronously control the counter and also is sampled asynchronously by the clock enable pipeline it changes state in the middle of a clock cycle (on the negative edge of the clock). This is to provide proper counter sample and hold time. Table 1 also indicates the decision that will be made based on these values.

Case 1 and Case 4 represent definite results; the counter snapshots are clearly valid in case 1 and not valid in case 4. Because the error vote lines could be a fault itself, these cases do not look at it. In the Cases 2 and 3, the error vote logic determines that it has one good sample and could use that sample in the comparison. However, every signal including the count from that CPU is suspect and not trustworthy. To resolve this question, it uses a bused "vote error" signal distributed between the CPUs on error bus 107 forming part of inter-CPU bus 18. That is, the CPU error vote logic 122 checks the vote error signal from the non-suspect CPU. Because of clock differences between itself and the other processor, the other processor may not have a usable snapshot. If the other non-suspect CPU, has driven its vote error signal high, indicating that it has no valid register samples, then the error vote logic will not use its sample either. Otherwise, it will use its valid snapshot in the comparison. In any case, error status information will be posted on bus 21 via bus interface 56.

If both of the CPUs are suspect, then the CPU making that determination is the faulty unit and it does not matter what decision it makes. The other processors will vote to ignore this CPU and continue in synchronization.

The error vote logic 122 may preferably implement the decision results of Table 1 in a programmable logic device (PLD).

Figure 8:
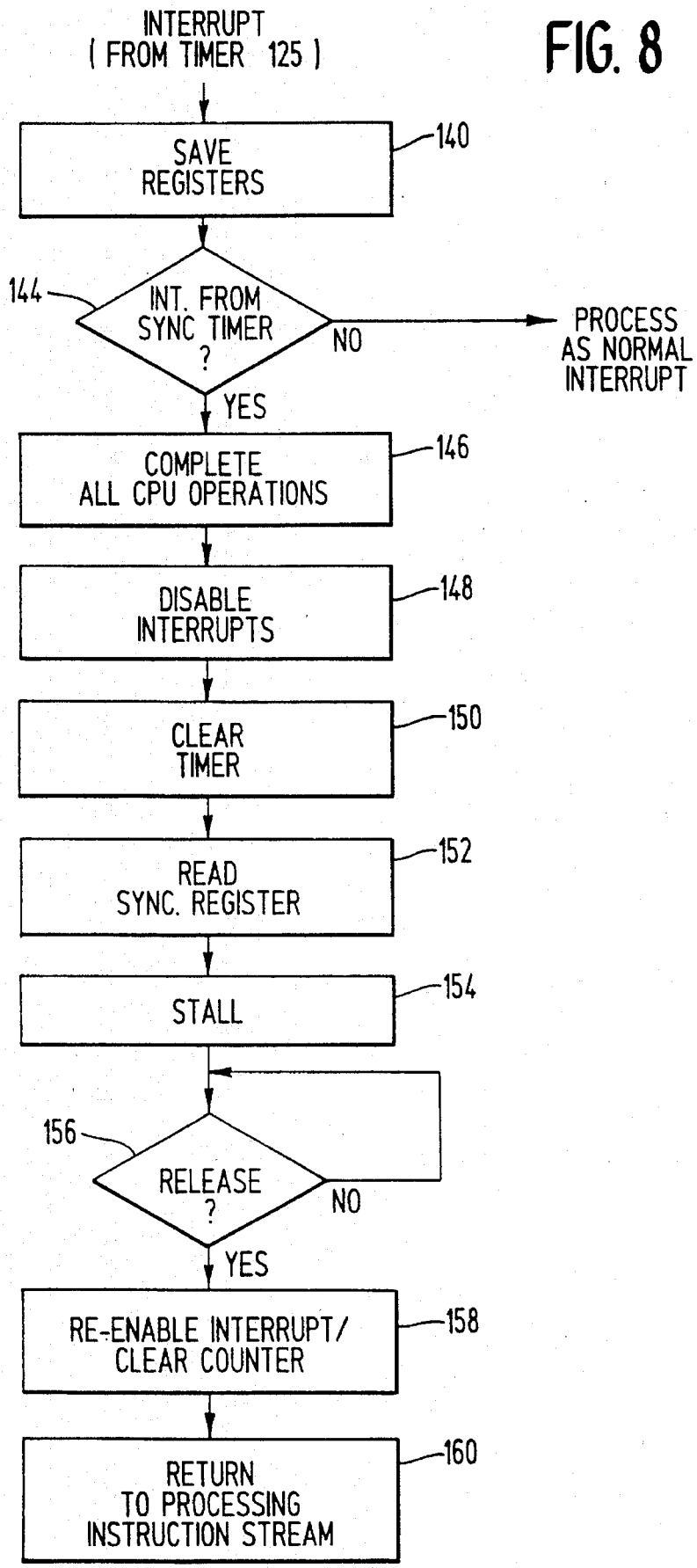
FIG. 8 is a flow diagram illustrating the steps in the CPU clock drift removal routine implemented by the present invention.

Referring to FIG. 8, the software interrupt routine which initiates the clock drift removal synchronization operation in conjunction with drift removal synchronization logic 124, is illustrated. As discussed above in relation to FIGS. 4, 5 and 6, timer 125 periodically issues an interrupt along line 126 to initiate the clock drift removal routine of FIG. 8. Timer 125 is chosen to provide a sufficiently frequent interrupt to prevent clock drift exceeding a desired range, e.g., 32 clock cycles. For example a 10 millisecond timer 125 will be suitable. Depending upon the amount of clock cycle drift which may be tolerated, and the rate of clock drift for any specific system, however, the interrupt timer 125 may be adjusted accordingly.

Preferably, upon time out, the timer 125 presents a high priority interrupt signal. This high priority interrupt will occur at the same clock count in each of the CPUs -A, -B, -C, however, at a different point in real time. The high priority interrupt calls the routine illustrated in FIG. 8 from the kernel code. This routine causes all pending operations in the CPUs to be completed, and then instructs the synchronization circuitry 124 in each of the CPUs to initiate a drift removal operation. This may preferably be achieved by using a special read instruction which is provided to the synchronization circuit 124 which then impose a variable length stall in each of the CPUs. As will be discussed in more detail below in relation to FIGS. 9 and 10, after this synchronization is completed each of the CPUs will start up clock count aligned and substantially aligned in real time.

More specifically, referring to FIG. 8, in response to the interrupt signal from timer 125, the software synchronization routine at step 140 first saves the state of the registers in the CPUs. The specific registers which need to be saved will depend on the way the specific processor handles interrupts. In certain processors this step may be dispensed with. Next, at step 144, the routine determines whether or not the interrupt was caused by the synchronization timer 125 (referring to FIGS. 4, 5 and 6). The Step 144 may for example comprise interrogating an interrupt cause register to ascertain the source of the interrupt signal. At step 144, the routine branches depending upon the results of the interrupt cause determination. If the interrupt is not from the synchronization timer 125 then the routine goes to standard interrupt processing. In these cases, the interrupt was previously aligned to clock count, in the manner discussed below in relation to FIGS. 15–19. If the determination at step 144 is that the interrupt is from synchronization timer 125 then the routine proceeds to step 146.

At step 146 the routine instructs the CPUs to complete all operations currently being performed by the processors 40 in each CPU (referring to FIG. 2). These instructions at step 146 will cause the instruction stream being processed in each of the processors 40 to wait for the completed results of the current operations before proceeding. For example, the R4000 processor designed by MIPS Computers, Inc. and discussed above in relation to FIG. 2, has two separate units that can operate in parallel (floating point operations and fixed point multiply/divide operations). Thus, appropriate instructions to the R4000 processor at step 146 in FIG. 8 would include: (1) finish all floating point; and (2) finish all integer multiply/divide operations. After the instructions to complete all pending operations are sent to processors 40 at step 146, the routine proceeds to step 148 as further illustrated in FIG. 8.

At step 148 interrupts are disabled at the protocol conversion circuit so the processor bus is not requested from the CPU 40 during the synchronization routine, in a preferred embodiment. At step 150 illustrated in FIG. 8, the synchronization routine clears the timer 125 and disables the count input thereto. Since this routine may be called in cases other than in response to a high priority interrupt, clearing it here guarantees that it will not time out during the variable length stall illustrated in FIG. 8.

At step 152 the drift removal synchronization routine issues the special read command to initiate the drift removal synchronization by synchronization circuitry 124 (referring to FIGS. 4, 5 and 6). As noted in step 152 of FIG. 8, this special read instruction is identified as "read sync register" which initiates the drift removal operation. At step 154, the routine stalls all other external visible and controllable events and instructions from execution until the drift removal synchronization operation is completed by the synchronization circuit 124. As illustrated by decision step 156, the synchronization routine maintains the stall on all instruction execution until it is determined that the release signal has been received from the synchronization circuit 124. At that point, the routine proceeds to step 158 where the interrupts are reenabled and the timer 125 is cleared and reenabled. Finally, at step 160 the instruction stream is reinstituted with the CPUs now aligned in real time as well as clock cycle aligned.

Figure 9:
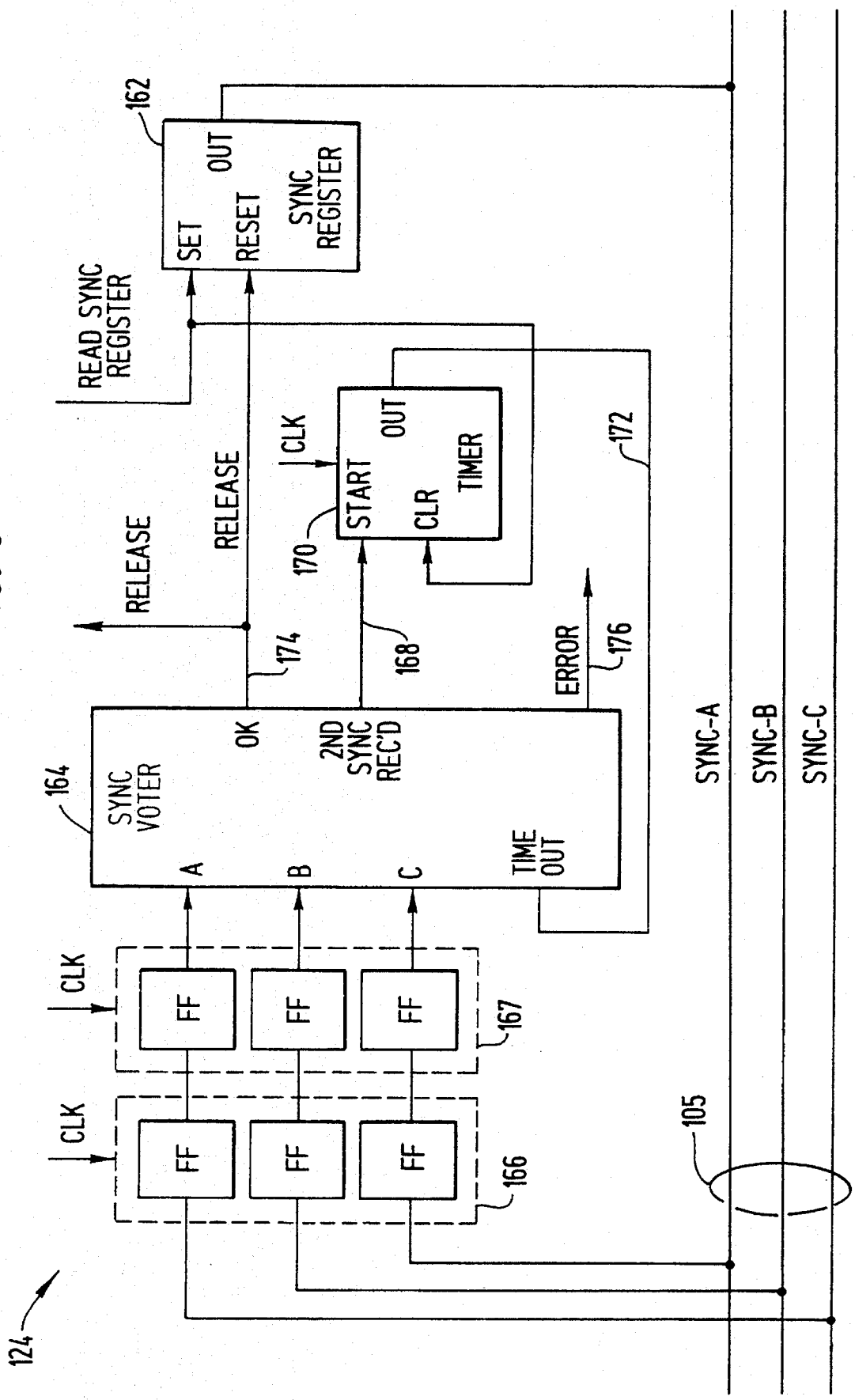
FIG. 9 is an electrical schematic drawing of the drift removal synchronization circuit of FIGS. 4, 5 and 6.

Referring to FIG. 9, a preferred embodiment of the drift removal synchronization circuit 124 as illustrated in an electrical schematic drawing. Also illustrated in FIG. 10, are timing diagrams illustrating the timing of signals on lines SYNC_A, SYNC_B and SYNC_C of FIG. 9 assuming that CPU-A is the CPU with the fastest oscillator.

Figure 10:
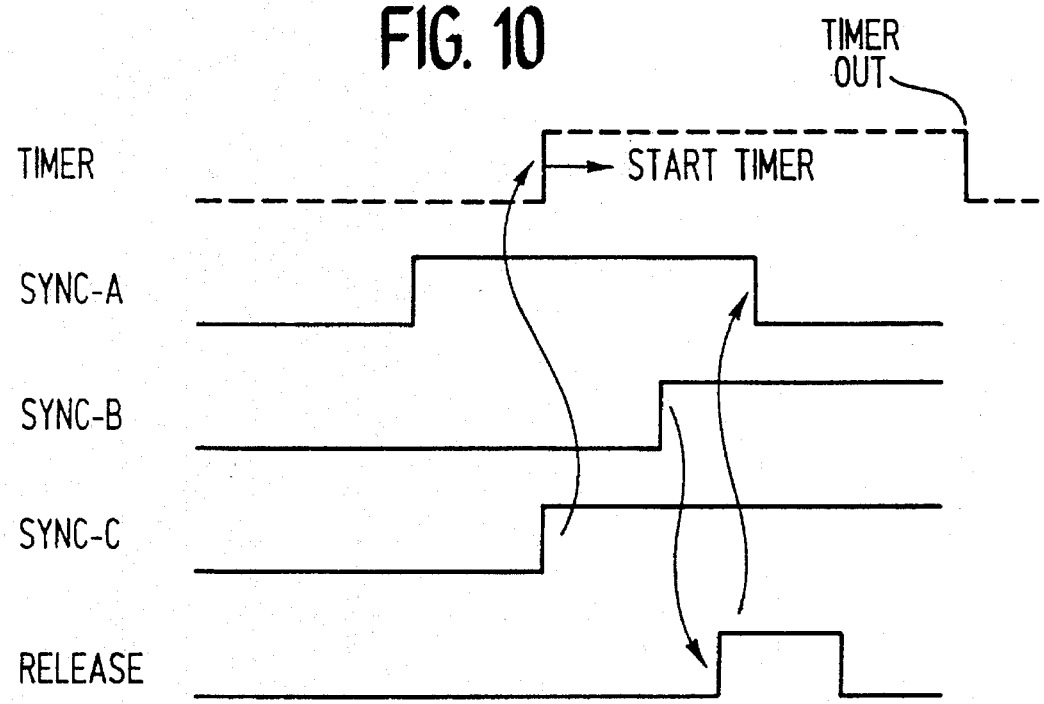
FIG. 10 is a timing diagram of the synchronization circuit of FIG. 9.

Referring to FIGS. 9 and 10, upon completion of the read sync register step 152 in the software synchronization routine of FIG. 8, that instruction is decoded and provided to the sync register 162 in the synchronization circuit 124. This decode of the read sync register instruction provided to sync register 162 causes the sync register output to transition, e.g., from low to high, which output is provided to the sync bus 105 which forms part of inter-CPU bus 18 shown in FIG. 1. If, for example, the circuit illustrated in FIG. 9 corresponds to CPU-A, then the output of sync register 162 would be provided to line SYNC_A in sync bus 105. The matching synchronization circuits in CPUs B and C in turn would have their sync register outputs coupled to SYNC_B and SYNC_C respectively. Thus, assuming the CPU-A oscillator to be the fastest of the three CPUs, the SYNC_A transition appears first along bus line SYNC_A as illustrated in FIG. 10. This output provided along bus line SYNC_A is provided to synchronization voting circuitry 164 in each of CPUs A, B and C.

As illustrated in FIG. 9, the sync voting circuitry 164 has inputs for receiving the SYNC signal from each of CPUs A, B, and C at inputs A, B, C, respectively. These inputs are provided via clock alignment circuits 166, 167 which align the pulses provided along lines SYNC_A, SYNC_B and SYNC_C to the local clock in the CPU receiving the signals. For example, a pair of flip flops may be employed on each line corresponding to circuits 166, 167, each flip flop receiving the local clock pulse thereto, to remove any metastability and align the inputs to the local clock.

After the first SYNC pulse is received by synchronization voting circuit 164, that circuit is ready for the next of the sync pulses to arrive along SYNC bus 105. If, as illustrated in FIG. 10, the next to arrive is SYNC_C from CPU-C, then voting circuit 164 outputs a timer start signal along line 168 which starts timer 170. Timer 170 is set to have a count out at a desired number of clock pulses corresponding to the allowed drift between the CPUs. For example, if as noted above it is desired to maintain the CPUs within 32 clock cycles of drift, timer 170 may be set to time out at 32 clock pulses, or preferably several clock counts more than this to allow for slight clock misalignment. When the count value is reached by timer 170 a time out signal is provided along line 172 to synchronization voting circuit 164.

Once the second SYNC pulse is received by voting circuit 164, it waits to determine whether the third SYNC pulse is received within the timer limit set by timer 170 or whether the time out occurs first. In the former case, all three CPUs are within the allowed clock drift, e.g. 32 clock cycles, and the voting circuit 164 determines that it is okay to release the CPUs to continue processing the instruction stream. This eventuality is indicated by the timing diagram of FIG. 10 where the third to occur SYNC pulse SYNC_B occurs before the time out of timer 170 and the release pulse is provided as indicated. This release pulse is provided by the synchronization voting circuit 164 along line 174 to reset the sync register 162 and is also provided to bus interface circuit 56 (as illustrated in FIG. 2) which in turn provides the release signal to the processor 40 via protocol conversion circuit 50. This synchronization voting procedure will occur simultaneously in each of the three CPUs and since the release is initiated at the same time by the third SYNC pulse (i.e., SYNC_B in the example of FIG. 10) it will result in release signals being provided in each of the CPUs within one or two clock cycles of each other. Thus, each of the CPUs will be released to continue processing the instruction stream aligned in real time to within one or two clock cycles.

If, on the other hand, timer 170 times out prior to receipt of the third SYNC pulse by the synchronization voting circuit 164, the release signal will be generated in the two stalled processors and circuit 164 will issue an error signal along line 176. This error signal indicates that the CPUs are not within the allowed clock drift of each other and initiates an error interrupt routine.

Accordingly, it will be appreciated that the synchronization circuitry 124 provides, in a relatively simple configuration, alignment of the three CPUs within one or two clock cycles of real time periodically in response to the interrupt timer 125 (referring to FIGS. 4, 5 and 6).

Local Memory Refresh Control:

Referring to FIGS. 11–14, the operation of the memory control circuit 60 and refresh timer 71 which control the refresh of the local memory 16 (referring to FIG. 2) are illustrated.

Figure 11:
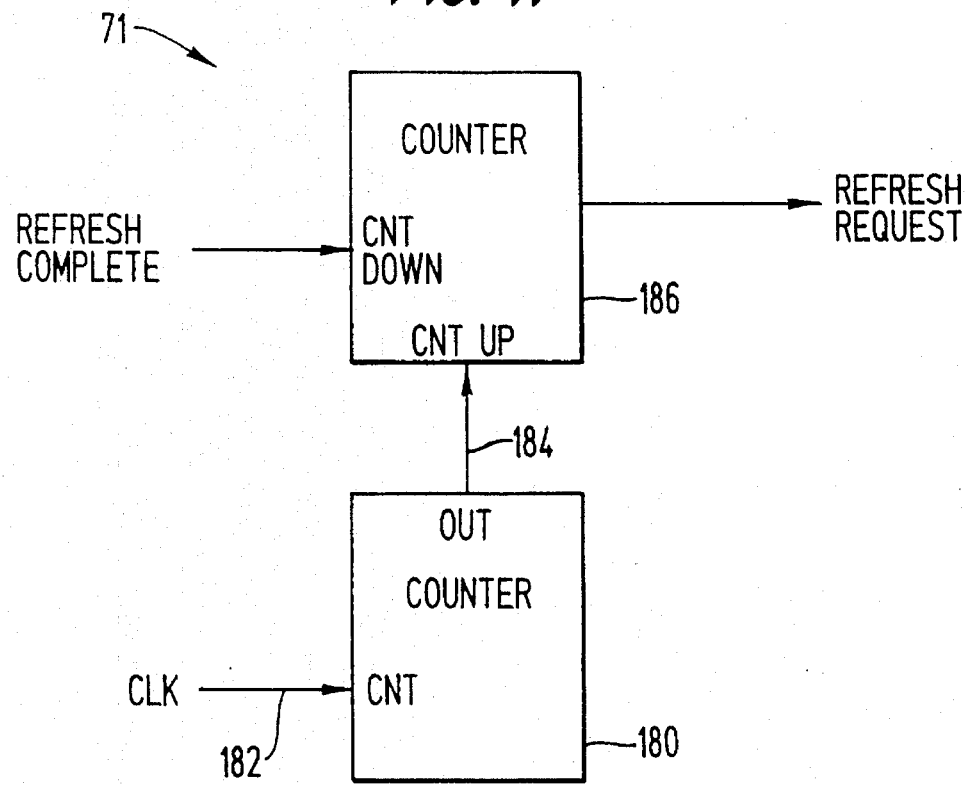
FIG. 11 is an electrical schematic drawing of the local memory refresh timer employed in the CPU of FIG. 2.

Referring first to FIG. 11, the refresh timer 71 is illustrated in an electrical schematic drawing. As noted above, the local memory 16 is preferably a dynamic random access memory (DRAM) which needs to be periodically refreshed in order to prevent loss of data stored therein. Timer 71 ensures that the refresh occurs sufficiently rapidly to prevent such loss of data for the particular design specifications of the DRAM employed for local memory 16. Thus, refresh timer 71 employs a counter 180 which receives clock signals along line 182 to the count input thereto, which counter is set to time out after a predetermined number of clock cycles corresponding to the desired refresh rate. This counter time out is provided along line 184 to a second counter 186. The second counter 186 allows more than one refresh request to be "stacked up" awaiting execution by the local memory control 60. The second counter 186 receives the output from counter 180 at its count up input along line 184. As long as the count of counter 186 is greater than 0 it applies a refresh request signal along at its output. As local memory refreshes are completed a refresh complete indication is provided to a counter down input of second counter 186 to reduce the count value of the counter. Thus, several counter outputs of the first counter may be accumulated in the second counter 186 maintaining a continuing refresh request output from the second counter 186, which refresh request is only terminated when the refresh complete signal has decremented the second counter 186 down to 0. This thus provides a convenient method to keep track of the number of refreshes required to maintain the dynamic local memory within specifications of the particular DRAM employed.

Figure 12:
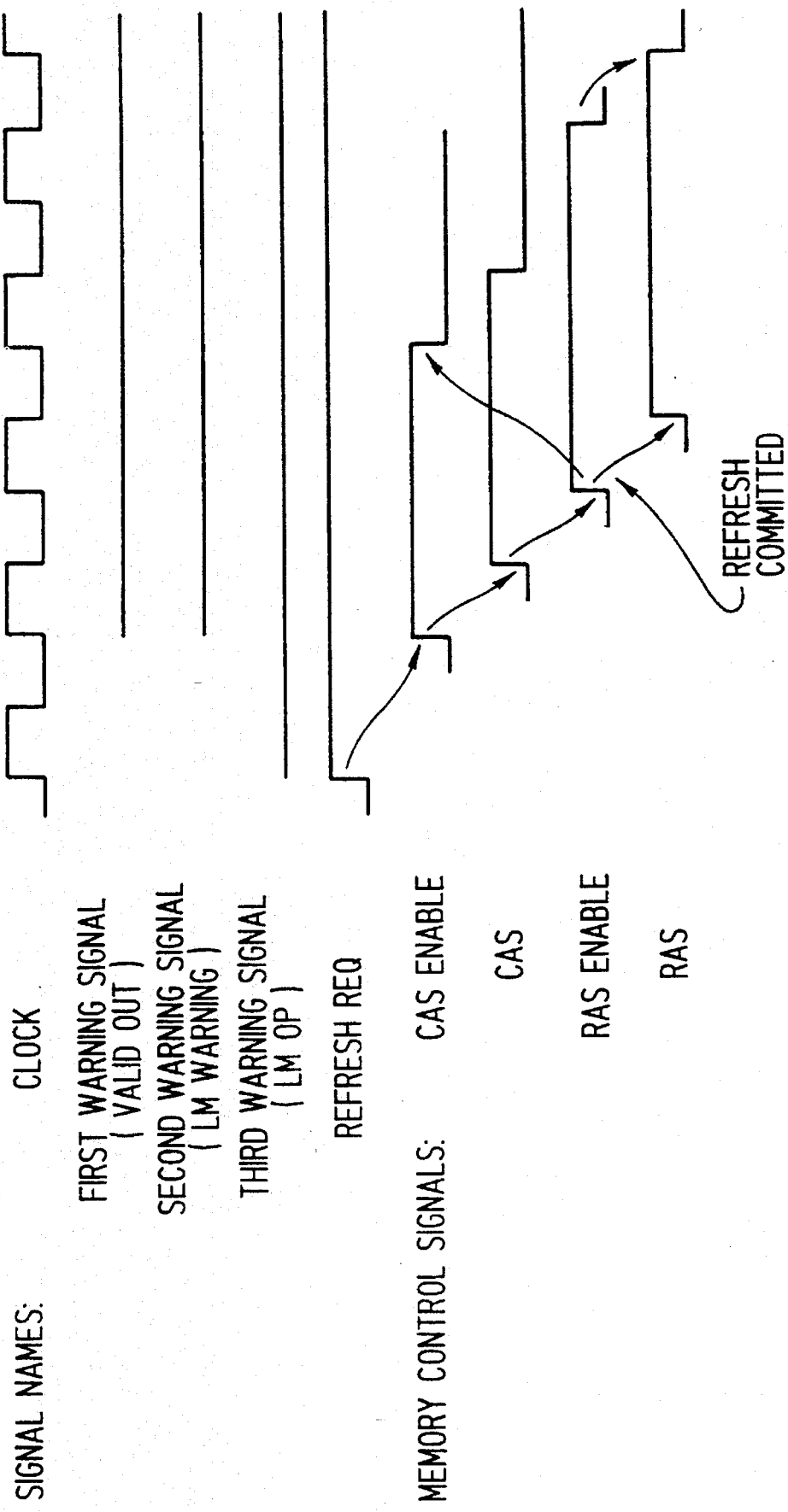
FIGS. 12, 13 and 14 are timing diagrams illustrating the hidden local memory refresh control provided by the local memory controller of FIG. 2.
Figure 13:
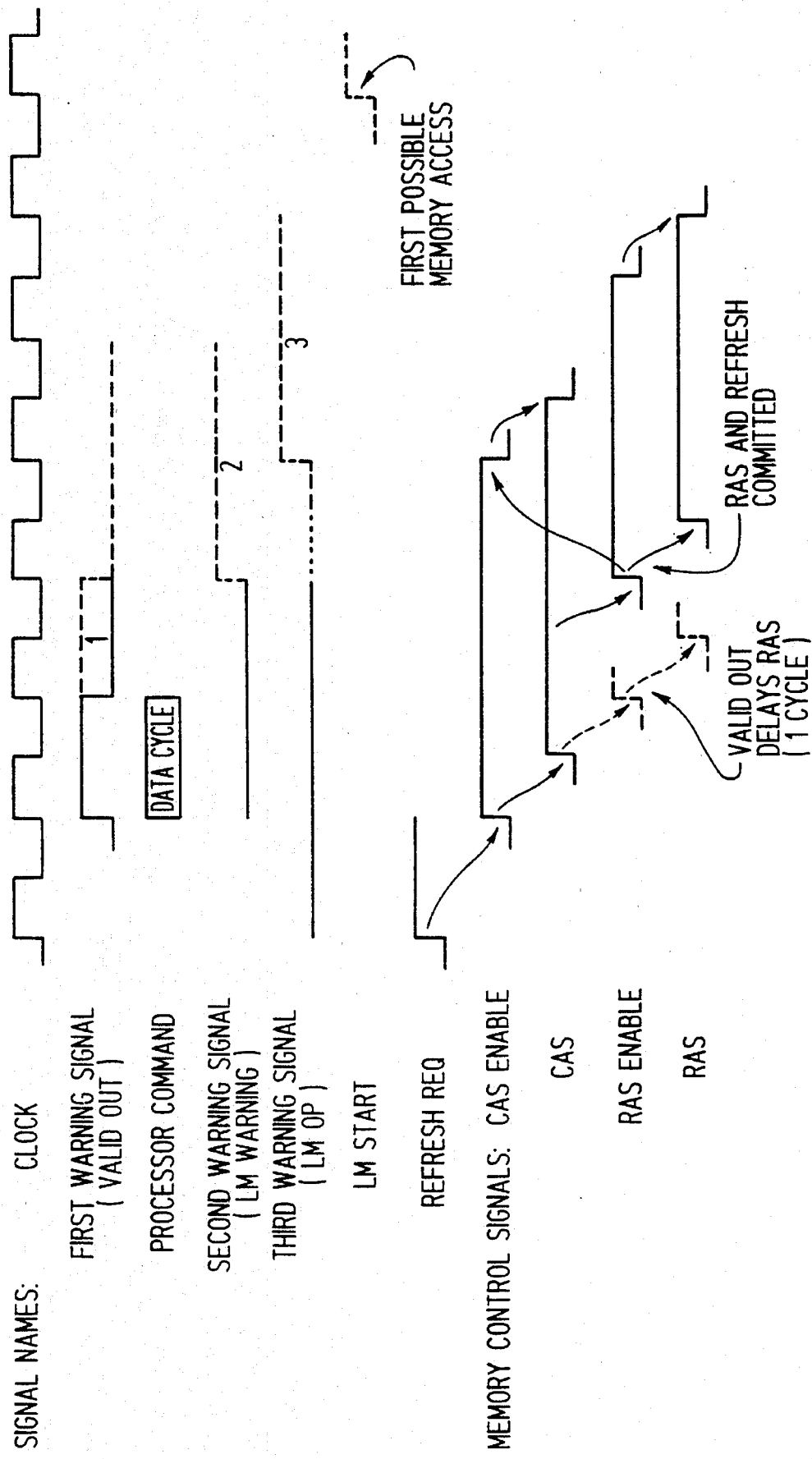
Figure 14:
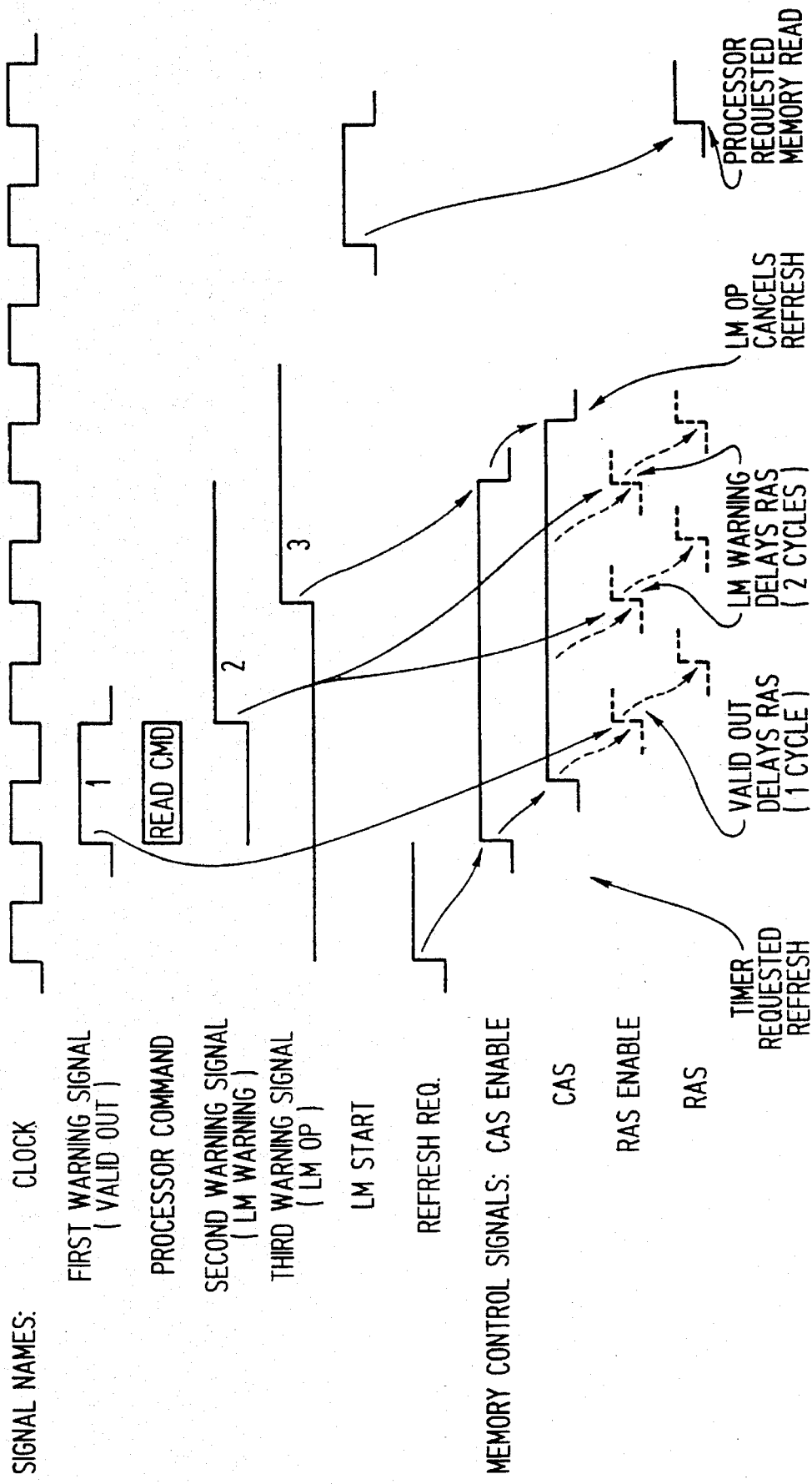

Referring to FIGS. 12, 13 and 14 timing diagrams illustrating the implementation of refreshes by the local memory control 60 are illustrated for several different situations.

As shown in FIGS. 12, 13 and 14, there are in addition to the local clock signal four signals provided to the local memory controller 60 which are used by the local memory controller to control the refresh timing. More specifically, the local memory controller receives a First Warning Signal (VALID OUT) directly from processor 40. A Second Warning Signal (LM WARNING) and a Third Warning Signal (LM OP) are both received from the protocol conversion circuit 50, as discussed above in relation to FIG. 3. The refresh request signal is provided from the refresh timer 71. These signals are used by the local memory controller 60 to control timing signals to the DRAM to control the refresh. In particular, local memory controller 60 generates the following signals: CAS ENABLE, which enables CAS (if interleaved memory banks are employed for local memory 16, then an EVEN/ODD timing signal which controls which of two banks of interleaved memory are addressed by the local memory controller is provided here instead); CAS, the Column Address Strobe signal which is conventionally employed to signal address of a column of memory in a DRAM; RAS ENABLE; and RAS, the Row Access Strobe which selects a row of memory addresses within the DRAM.

In the refresh control illustrated, a refresh is initiated in the DRAM by asserting a CAS signal to the DRAM prior to a RAS signal, which refresh is then undertaken by the DRAM in response to the RAS signal. In conventional DRAM control, memory reads or writes are undertaken by first asserting a RAS signal and an address identifying a row to be addressed in the DRAM, followed by a CAS signal and address which identifies the column to be addressed, thereby identifying a memory location in the address space of the DRAM. By asserting CAS before RAS as in the timing diagrams of FIGS. 12, 13 and 14, the DRAM is alerted to a refresh request as opposed to a memory read or write operation. It should be appreciated, however, that other DRAM designs may employ different signals to initiate a refresh of the memory and accordingly the illustrated signals are merely illustrative of a preferred embodiment incorporating one presently conventional DRAM design.

The timing signals illustrated in FIGS. 12, 13 and 14 for controlling the timing of refresh control, ensure that refresh of the local memory 16 is only undertaken when the local memory is not being accessed by the processor 40. In this way, a processor execution cycle involving access to the local memory is never stalled to allow a refresh to occur. Such stalls introduce potential synchronization problems between the respective CPUs.

This is achieved by monitoring the three warning signals VALID OUT, LM WARNING and LM OP, which provide successively higher decoded indications of a potential access to local memory. These signals are employed by the local memory control 60 to either stall the refresh cycle or abort it completely depending upon the definiteness of the local memory access request from the processor 40. This three stage warning procedure allows sufficient time for either aborting a local memory refresh or completing it prior to any given local memory access by the processor 40 thereby completely hiding the refresh operations from the processor.

As discussed previously in relation to the protocol conversion circuitry 50, the first warning signal (VALID OUT), which indicates that the processor 40 is presenting some command to the protocol conversion circuit 50, is sent directly to the local memory controller 60 from the processor. This thus provides the greatest advanced warning of a potential access to the local memory 16 with, however, the least certainty that a local memory request has in fact been presented. That is, VALID OUT may indicate a number of operations, only one of which is a memory cycle to the local memory 16. Therefore, upon receipt of the First Warning Signal (VALID OUT) the local memory controller circuit 60 merely delays a local memory refresh for a period of time sufficient to allow determination of whether or not the Second Warning Signal is received. In the illustrated embodiment, the receipt of the First Warning Signal (VALID OUT) from the processor 40 delays the local memory refresh by one clock cycle only if the memory control logic would have committed a refresh on that cycle. One cycle is sufficient time for the protocol conversion circuit 50 to decode the processor signal sufficiently to issue a Second Warning Signal (LM WARNING) which indicates that the protocol conversion circuit 50 is processing a request which may be destined for the local memory. If this Second Warning Signal is received by the local memory controller 60 before the refresh is initiated, the memory refresh will be delayed indefinitely, i.e., until the LM warning signal is removed. Finally, the Third Warning Signal (LM OP) indicates that access to the local memory has been requested by the processor 40 and that in several cycles the memory controller 60 will receive a request for local memory access (LM START). Receipt of the Third Warning Signal (LM OP) will cancel a speculative memory refresh cycle and prepare the memory to execute the access request from the processor.

Accordingly, through the use of the three levels of warning signals corresponding to different levels of decoding of a processor instruction, the present invention allows a local memory refresh to be either completed prior to a local memory access by the processor or aborted to allow such an access. In this way, the local memory refreshes are completely hidden from the processor allowing the refresh of the local memory to be ignored for the purposes of synchronization between the multiple CPUs of the fault tolerant computer system.

The manner in which the various signals are employed to ensure the hiding of the refresh control may be better appreciated by consideration of three distinct examples illustrated in FIGS. 12, 13 and 14 respectively.

In FIG. 12, a refresh of the local memory is illustrated which proceeds without interruption from any warning signals indicating a potential access of local memory from the processor 40. Thus, as may be seen from inspection of FIG. 12 each of the three warning signals are low throughout the refresh procedure. (It should be appreciated that inverted logic signals may equally be employed and may be preferred in some cases due to noise resistance.) To initiate refresh, the refresh request signal from the refresh timer 71 is high indicating the need for a refresh in accordance with the design requirements of the DRAM being refreshed. The refresh request signal in turn triggers CAS ENABLE signaling a speculative refresh, since no local memory warning signals have been detected. One half clock cycle later, the CAS signal is provided to the DRAM by the local memory controller 60. Since a CAS signal presented to the DRAM before RAS signals the DRAM that a refresh is being requested, the DRAM will initiate a refresh when the RAS signal is supplied to the DRAM. One half clock cycle after CAS no warning signals have been received by the local memory controller 60 so the RAS enable signal goes high, followed by RAS itself another half clock cycle later.

As further shown in FIG. 12, the RAS ENABLE signal going high disables CAS ENABLE and that going low in turn brings the CAS signal low. When CAS transitions low while RAS and RAS ENABLE remain high, the DRAM initiates its internal refresh of the memory. The refresh will be completed when RAS has been asserted the required number of cycles depending on the specific DRAM design. Thus it will be appreciated from FIG. 12 that the refresh was completed without interference from the warning signals indicating processor access to the local memory and further that the refresh was completely hidden from the local processor 40.

Referring to FIG. 13 the timing of the signals provided to the local memory control circuit 60 and the memory control signals output therefrom are illustrated for the situation where a first warning signal is provided which delays the refresh by one clock cycle. The second and third warning signals are not provided, however, allowing the refresh to continue through completion.

More specifically, referring to FIG. 13 it will be appreciated that the refresh request signal initiates a speculative refresh by CAS ENABLE first going high as illustrated followed by CAS going high as in the case of the refresh of FIG. 12. At this point, however, the First Warning Signal (VALID OUT) is received from the processor 40.

As indicated by the dashed lines in FIG. 13, after the CAS signal is provided it would normally be followed within one clock transition by the RAS ENABLE signal which in turn would be followed within another clock transition by the RAS signal. However, since the local memory controller 60 receives the First Warning Signal (VALID OUT) after providing the CAS signal, the RAS ENABLE signal is delayed one clock cycle as shown by the difference between the dashed and solid lines in FIG. 13. Similarly, the RAS signal is delayed one clock cycle also as shown by the difference between the dashed and solid lines in FIG. 13. Although refresh is thus delayed one clock cycle, the Second Warning Signal (LM WARNING) does not occur within the predetermined time from the First Warning Signal, i.e., within one clock cycle. The RAS ENABLE line thus goes high one cycle later, as illustrated by the solid line in FIG. 13, thereby committing the local memory to refresh. The local memory refresh control thus proceeds despite the initial warning since the further decoding of the processor request did not trigger the second warning in time to stop the refresh.

Still referring to FIG. 13, it will be appreciated from review of the dashed lines for the Second Warning Signal (LM WARNING) and the Third Warning Signal (LM OP) that even if these signals occurred as indicated the local memory refresh would be committed and would proceed. As further indicated by the LM START signal indicating the start of the local memory access by the processor, however (shown as a dashed line timing signal), this access could not be requested prior to the completion of the refresh of the local memory. Therefore, the refresh commit point is chosen such that once the refresh has been committed it will be completed before access to the memory is required by the processor.

Referring to FIG. 14, the timing sequence of the local memory refresh control is illustrated for a case where a memory refresh is cancelled due to a local memory access being signaled by the appropriate sequence of First, Second and Third warning signals.

More specifically, as shown in FIG. 14, after the refresh request signal initiates a CAS ENABLE commencing a speculative refresh cycle, the First Warning Signal (VALID OUT) is provided to the local memory controller 60. This delays the RAS ENABLE by one clock cycle as illustrated by the shifting of that signal, shown in dashed lines, from the first to second position. The RAS signal is also delayed. Next, before the RAS ENABLE can transition from low to high, the Second Warning Signal (LM WARNING) is received. This delays the RAS ENABLE and RAS signals for an additional two clock cycles as shown by the second and third set of dashed lines in FIG. 14. As further shown in FIG. 14, finally the third warning signal (LM OP) turns off CAS ENABLE which will cause the local memory refresh operation to be cancelled by local memory controller 60.

For example, as illustrated in FIG. 14, the Third Warning Signal (LM OP) can be employed to cause CAS ENABLE and CAS signals to transition from high to low prior to RAS going high, removing the necessary indication, for conventional DRAMs, of a refresh operation. As shown by the LM START lines and the memory access indication the memory access is triggered after the refresh operation has been cancelled. Thus, access to the local memory by the processor may proceed without any indication of the aborted refresh operation being provided to the processor 40. The first and second warning signals (VALID OUT and LM WARNING) only delay committing the refresh cycle. The refresh request signal and the third warning signal control starting or cancelling a speculative refresh cycle, respectively.

From the foregoing examples of successful and aborted refresh operations illustrated by FIGS. 12, 13 and 14, it will be appreciated that the present invention allows refreshes to either be successfully completed prior to a memory access being possible by the processor or aborting a memory refresh to allow such a memory access, without such events impacting on the access operations by the processor. Therefore, the sequence of warning signals employed by the local memory control circuit 60 to either allow the refresh or abort at specific timing sequences relative thereto, allows the refresh operations to be hidden from the processor. This hiding of refresh operations avoids an additional complication in synchronization between the multiple CPUs in a fault tolerant computer system. This in turn avoids potentially complicated voting hardware which would have to vote refresh requests in a manner similar to external interrupt voting described below. Further, since refreshes are hidden, the processor will never be delayed because of refresh and forced to wait for access to the local memory.

Interrupt Synchronization:

The three CPUs of the system of FIG. 1 are required to function as a single logical processor, thus requiring that the CPUs adhere to certain restrictions regarding their internal state to ensure that the programming model of the three CPUs is that of a single logical processor. Except in failure modes and in diagnostic functions, the instruction streams of the three CPUs are required to be identical. If not identical, then voting global memory accesses would be difficult; the voter would not know whether one CPU was faulty or whether it was executing a different sequence of instructions. The synchronization scheme described above ensures that the code stream of any CPU will not diverge from the code stream of the other CPUs due to CPU I/O requests, unless a failure occurred. External interrupt synchronization is also required, however.

All interrupts are required to occur synchronous to a specific clock count, ensuring that the instruction streams of the three processors CPU-A, CPU-B and CPU-C will not diverge as a result of interrupts. Several scenarios exist whereby interrupts occurring on a different clock count would cause the code streams to diverge. For example, an interrupt causing a context switch on one CPU before process A completes, but causing the context switch after process A completes on another CPU would result in a situation where, at some point later, one CPU continues executing process A, but the other CPU cannot execute process A because that process had already completed. If in this case the interrupts occurred on different instructions, then just the fact that the exception program counters were different could cause problems. The act of writing the exception program counters to global memory would result in the voter detecting different data from the three CPUs, producing a vote fault.

Certain types of exceptions in the CPUs are inherently synchronous to the clock count. One example is a breakpoint exception caused by the execution of a breakpoint instruction. Since the instruction streams of the CPUs are identical, the breakpoint exception occurs at the same instruction on all three of the CPUs. Similarly, all such internal exceptions inherently occur synchronous to the instruction stream.

External exceptions are not inherently synchronous to each CPUs clock count. I/O devices 26, 27 or 30 have no information about the virtual time of the three CPUs 11, 12 and 13. Therefore, all interrupts that are generated by these I/O devices must be synchronized to the clock count before presenting it to the CPUs, as explained below.

External devices view the three CPUs as one logical processor, and have no information about the synchronaity or lack of synchronaity between the CPUs, so the external devices cannot produce interrupts that are synchronous with the individual instruction stream of each CPU. Without any sort of synchronization, if some external device drove an interrupt at some time real time, and the interrupt was presented directly to the CPUs at this time then the three CPUs would take an interrupt at different instructions, resulting in an unacceptable state of the three CPU's. This is an example of an event (assertion of an interrupt) which is synchronous to real time but not synchronous to each CPUs clock count.

Figure 15:
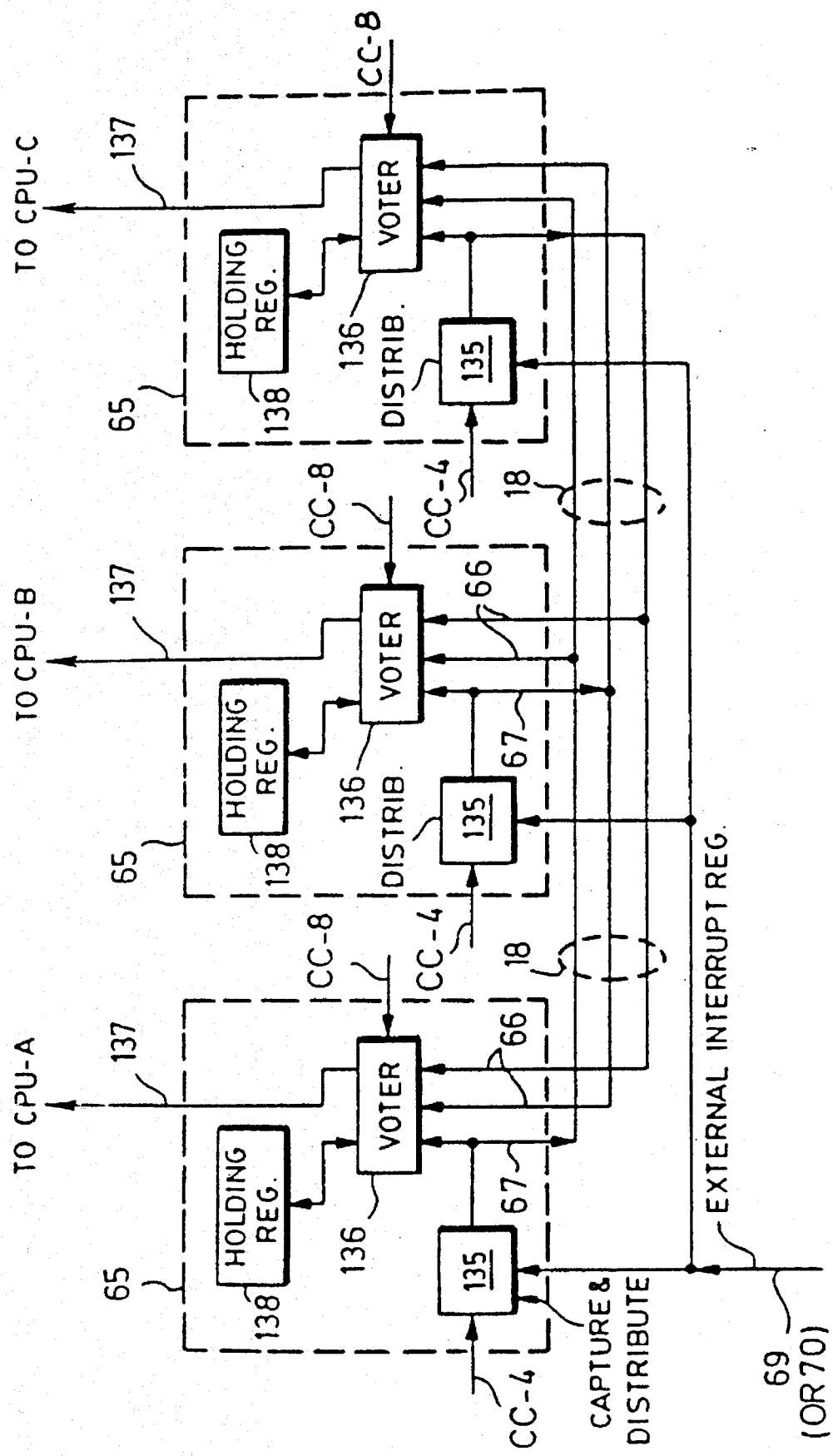
FIG. 15 is an electrical schematic drawing of the interrupt synchronization circuit used in the CPU of FIG. 2.
Figure 18:
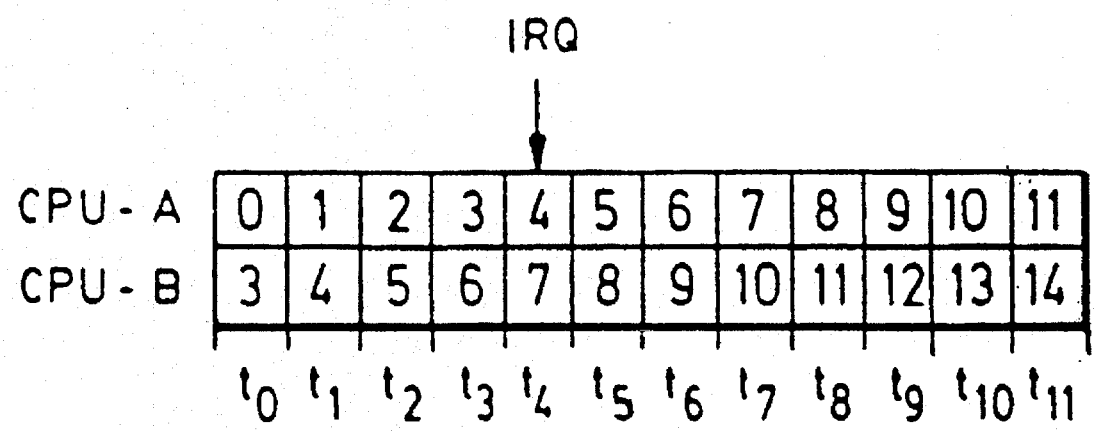

Interrupts are synchronized to each CPUs clock count in the system of FIGS. 1–2 by performing a distributed vote on the interrupts and then presenting the interrupt to the processor on a predetermined cycle count. FIG. 15 shows a more detailed block diagram of the interrupt synchronization logic 65 of FIG. 2. Each CPU contains a distributor 135 which captures the external interrupt from the line 69 or 70 coming from the modules 14 or 15; this capture occurs on a predetermined cycle count, e.g., at count-4 as signalled on an input line CC-4 from clock cycle counter 51 (illustrated in FIG. 2). The captured interrupt is distributed to the other two CPUs via the inter-CPU bus 18. These distributed interrupts are called pending interrupts. There are three groups pending interrupts, one group from each CPU 11, 12 and 13. A voter circuit 136 captures the pending interrupts and performs a vote to verify that all of the CPUs did receive the external interrupt request. On a predetermined cycle count (detected from the clock cycle counter 51), in this example cycle-8 received by input line CC-8, the interrupt voter 136 presents the interrupt to the protocol conversion circuit and then on to its respective microprocessor 40 via line 137. Since the cycle count that is used to present the interrupt is predetermined, all of the microprocessors 40 will receive the interrupt on the same clock count and thus the interrupt will have been synchronized.

FIG. 16 shows the sequence of events for synchronizing interrupts to the clock count. The rows labeled CPU-A, CPU-B, and CPU-C indicate the cycle count in the counter of each CPU at a point in real time. The rows labeled IRQ_A_PEND, IRQ_B_PEND, and IRQ_C_PEND indicate the state of the interrupt pending bits coupled via the inter-CPU bus 18 to the input of the voters 136 (a one signifies that the pending bit is set). The rows labeled IRQ_A_PEND, IRQ_B_PEND, and IRQ_C_PEND indicate the state of the interrupt input pin on the microprocessor 40 (the signals on lines 137), where a one signifies that an interrupt is present at the input pin. In FIG. 16, the external interrupt (EX_IRQ) is asserted on line 69 at $t_0$. If the interrupt distributor 135 captures and then distributes the interrupt on the inter-CPU bus 18 on cycle count 4, then IRQ_C_PEND will go active at $t_1$, IRQ_B_PEND will go active at $t_2$, and IRQ_A_PEND will go active at $t_4$. If the interrupt voter 136 captures and then votes the interrupt pending bits on cycle count 8, then IRQ_C will go active at $t_5$, IRQ_B will go active at $t_6$, and IRQ_A will go active at $t_8$. The result is that the interrupts were presented to the CPUs at different points in real time but at the same clock count (i.e. count 8).

FIG. 17 illustrates a scenario which requires the algorithm presented in FIG. 16 to be modified. Note that the clock cycle counter 51 is here represented by a module 8 counter. The external interrupt (EX_IRQ) is asserted at time $t_3$, and the interrupt distributor 135 captures and then distributes the interrupt to the inter-CPU bus 18 on cycle count 4. Since CPU-B and CPU-C have executed cycle count 4 before time $t_3$. The result is that CPU-A captures and distributes the external interrupt at time $t_4$. But if the interrupt voter 136 captures and votes the interrupt pending bits on cycle 7, the interrupt voter on CPU-A captures the IRQ_A_PEND signal at time $t_7$, when the two other interrupt pending bits are not set. The interrupt voter 136 on CPU-A recognizes that not all of the CPUs have distributed the external interrupt and thus places the captured interrupt pending bit in a holding register 138. The interrupt voters 136 on CPU-B and CPU-C capture the single interrupt pending bit at times $t_5$ and $t_4$ respectively. Like the interrupt voter on CPU-A, the voters recognize that not all of the interrupt pending bits are set, and thus the single interrupt pending bit that is set is placed into the holding register 138. When the cycle counter 51 on each CPU reaches a cycle count of 7, the counter rolls over and begins counting at cycle count 0. Since the external interrupt is still asserted, the interrupt distributor 135 on CPU-B and CPU-C will capture the external interrupt at times $t_{10}$ and $t_9$ respectively. These times correspond to when the cycle count becomes equal to 4. At time $t_{12}$, the interrupt voter on CPU-C captures the interrupt pending bits on the inter-CPU bus 18. The voter 136 determines that all of the CPUs did capture and distribute the external interrupt and thus presents the interrupt to the processor chip 40. At times $t_{13}$ and $t_{15}$, the interrupt voters 136 on CPU-B and CPU-A capture the interrupt pending bits and then present the interrupt to the processor chip 40. The result is that all of the processor chips received the external interrupt request at identical instructions, and the information saved in the holding registers is not needed.

Holding Register:

In the interrupt scenario presented above with reference to FIG. 17, the voter 136 uses a holding register 138 to save some state information. In particular, the saved state was that some, but not all, of the CPUs captured and distributed an external interrupt. If the system does not have any faults (as was the situation in FIG. 17) then this stated information is not necessary because, as shown in the previous example, external interrupts can be synchronized to the clock count without the use of the holding register 138. The algorithm is that the interrupt voter 136 captures and votes the interrupt pending bits on a predetermined clock count. When all of the interrupt pending bits are asserted, then the interrupt is presented to the processor chip 40 on the predetermined clock count. In the example of FIG. 17, the interrupts were voted on cycle count 7.

Referring to FIG. 17, if CPU-C fails and the failure mode is such that the interrupt distributor 135 does not function correctly, then if the interrupt voters 136 waited until all of the interrupt pending bits were set before presenting the interrupt to the processor chip 40, the result would be that the interrupt would never get presented. Thus, a single fault on a single CPU renders the entire interrupt chain on all of the CPUs inoperable.

The holding register 138 provides a mechanism for the voter 136 to know that the last interrupt vote cycle captured at least one, but not all, of the interrupt pending bits. The interrupt vote cycle occurs on the cycle count that the interrupt voter captures and votes the interrupt pending bits. There are only two scenarios that result in some of the interrupt pending bits being set. One is the scenario presented in reference to FIG. 17 in which the external interrupt is asserted before the interrupt distribution cycle on some of the CPUs but after the interrupt distribution cycle on other CPUs. In the second scenario, at least one of the CPUs fails in a manner that disables the interrupt distributor. If the reason that only some of the interrupt pending bits are set at the interrupt vote cycle is case one scenario, then the interrupt voter is guaranteed that all of the interrupt pending bits will be set on the next interrupt vote cycle. Therefore, if the interrupt voter discovers that the holding register has been set and not all of the interrupt pending bits are set, then an error must exist on one or more of the CPUs. This assumes that the holding register 138 of each CPU gets cleared when an interrupt is serviced, so that the state of the holding register does not represent stale state on the interrupt pending bits. In the case of an error, the interrupt voter 136 can present the interrupt to the processor chip 40 and simultaneously indicate that an error has been detected in the interrupt synchronization logic.

The interrupt voter 136 checks the state of the interrupt pending bits and the holding register 137 to determine whether or not to present an interrupt to the processor chip 40 and whether or not to indicate an error in the interrupt logic.

Modulo Cycle Counters:

The interrupt synchronization example of FIG. 17 represented the interrupt cycle counter 51 as a modulo N counter (e.g., a modulo 8 counter). Using a modulo N cycle counter simplified the description of the interrupt voting algorithm by allowing the concept of an interrupt vote cycle. With a modulo N cycle counter, the interrupt vote cycle can be described as a single cycle count which lies between 0 and N-1 where N is the modulo of the cycle counter. Whatever value of cycle counter is chosen for the interrupt vote cycle, that cycle count is guaranteed to occur every N cycle counts; as illustrated in FIG. 17 for a modulo 8 counter, every eight counts an interrupt vote cycle occurs. The interrupt vote cycle is used here merely to illustrate the periodic nature of a modulo N cycle counter. Any event that is keyed to a particular cycle count of a modulo N cycle counter is guaranteed to occur every N cycle counts.

A value of N is chosen to maximize system parameters that have a positive effect on the system and to minimize system parameters that have a negative effect on the system. First, some of the parameters will be described; $C_v$ and $C_d$ are the interrupt vote cycle and the interrupt distribution cycle respectively (in the circuit of FIG. 15 these are the inputs CC-8 and CC-4, respectively). The value of $C_v$ and $C_d$ must lie in the range between 0 and N-1 where N is the modulo of the cycle counter. $D_{max}$ is the maximum amount of clock count drift between the three processors CPU-A, -B and -C that can be tolerated by the synchronization logic. The processor drift is determined by taking a snapshot of the cycle counter from each CPU at a point in real time. The drift is calculated by subtracting the cycle count of the slowest CPU from the cycle count of the fastest CPU, performed as modulo N subtraction. The value of $D_{max}$ is described as a function of N and the values of $C_v$ and $C_d$.

First, $D_{max}$ will be defined as a function of the difference Cv-Cd, where the subtraction operation is performed as modulo N subtraction. This allows us to choose values of $C_v$ and $C_d$ that maximize $D_{max}$. Consider the scenario in FIG. 18. Suppose that $C_d$=8 and $C_v$=9. From FIG. 18 the processor drift can be calculated to be $D_{max}$=4. The external interrupt on line 69 is asserted at time $t_4$. In this case, CPU-B will capture and distribute the interrupt at time $t_5$. CPU-B will then capture and vote the interrupt pending bits at time $t_6$. This scenario is inconsistent with the interrupt synchronization algorithm presented earlier because CPU-B executes its interrupt vote cycle before CPU-A has performed the interrupt distribution cycle. The flaw with this scenario is that the processors have drifted further apart than the difference between $C_v$ and $C_d$. The relationship can be formally written as $$C_v - C_d < D_{max} - e \qquad \text{Equation (1)}$$

where e is the time needed for the interrupt pending bits to propagate on the inter-CPU bus 18. In previous examples, e has been assumed to be zero. Since wall-clock time has been quantized in clock cycle (Run cycle) increments, e can also be quantized. Thus the equation becomes $$C_v - C_d < D_{max} - 1 \qquad \text{Equation (2)}$$

where $D_{max}$ is expressed as an integer number of cycle counts.

Figure 19:
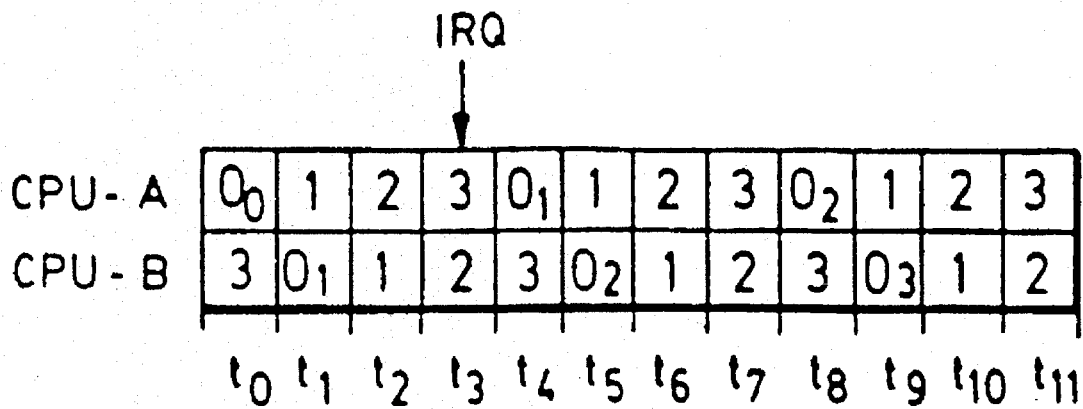

Next, the maximum drift can be described as a function of N. FIG. 19 illustrates a scenario in which N=4 and the processor drift D=3. Suppose that $C_d$=0. The subscripts on cycle count 0 of each processor denote the quotient part (Q) of the instruction cycle count. Since the cycle count is now represented in modulo N, the value of the cycle counter is the remainder portion of I/N where I is the number of instructions that have been executed since time $t_0$. The Q of the instruction cycle count is the integer portion of I/N. If the external interrupt is asserted at time $t_3$, then CPU-A will capture and distribute the interrupt at time $t_4$, and CPU-B will execute its interrupt distribution cycle at time $t_5$. This presents a problem because the interrupt distribution cycle for CPU-A has Q=1 and the interrupt distribution cycle for CPU-B has Q=2. The synchronization logic will continue as if there are no problems and will thus present the interrupt to the processors on equal cycle counts. But the interrupt will be presented to the processors on different instructions because the Q of each processor is different. The relationship of $D_{max}$ as a function of N is therefore $$N/2 > D_{max} \qquad \text{Equation (3)}$$

where N is an even number and $D_{max}$ is expressed as an integer number of cycle counts. (These equations 2 and 3 can be shown to be both equivalent to the Nyquist theorem in sampling theory.) Combining equations 2 and 3 gives $$C_v - C_d < N/2 - 1 \qquad \text{Equation (4)}$$

which allows optimum values of $C_v$ and $C_d$ to be chosen for a given value of N.

All of the above equations suggest that N should be as large as possible. The only factor that tries to drive N to a small number is interrupt latency. Interrupt latency is the time interval between the assertion of the external interrupt on line 69 and the presentation of the interrupt to the microprocessor chip on line 137. Which processor should be used to determine the interrupt latency is not a clear-cut choice. The three microprocessors will operate at different speeds because of the slight differences in the crystal oscillators in clock sources 17. There will be a fastest processor, a slowest processor, and the other processor. Defining the interrupt latency with respect to the slowest processor is reasonable because the performance of system is ultimately determined by the performance of the slowest processor. The maximum interrupt latency is $$L_{max} = 2N - 1 \qquad \text{Equation (5)}$$

where $L_{max}$ is the maximum interrupt latency expressed in cycle counts. The maximum interrupt latency occurs when the external interrupt is asserted after the interrupt distribution cycle $C_d$ of the fastest processor but before the interrupt distribution cycle $C_d$ of the slowest processor. The calculation of the average interrupt latency $L_{ave}$ is more complicated because it depends on the probability that the external interrupt occurs after the interrupt distribution cycle of the fastest processor and before the interrupt distribution cycle of the slowest processor. This probability depends on the drift between the processors which in turn is determined by a number of external factors. If we assume that these probabilities are zero, then the average latency may be expressed as $$L_{ave}=N/2+(C_v-C_d) \qquad \text{Equation (6)}$$

Using these relationships, values of N, $C_v$ and $C_d$ are chosen using the system requirements for $D_{max}$ and interrupt latency. For example, choosing N=128 and $(C_v-C_d)$=10, $L_{ave}$=74 or about 4.4 microsec. Using the preferred embodiment where a four bit (four binary stage) counter 51 is used as the interrupt sync counter, and the distribute and vote outputs are at CC-4 and CC-8 as discussed, it is seen that N=16, $C_v$=8 and $C_d$=4, so $L_{ave}$=16/2+(8-4)=12-cycles or 0.7 microsec.

While the invention has been described with reference to a specific embodiment, the description is not meant to be construed in a limiting sense. Various modifications of the disclosed embodiment, as well as other embodiments of the invention, will be apparent to person skilled in the art upon reference to this description. It is therefore contemplated that the appended claims will cover any such modifications or embodiments as fall within the true scope of the invention.

What is claimed is:

1. A fault tolerant computer system for processing an instruction stream, comprising:

a plurality of processor modules, each of said processor modules executing said instruction stream, each processor module having:

a processor for executing said instructions;

an independent clock for providing clock cycles for controlling execution of said instruction stream independently of said other processor modules;

a local memory coupled to said processor so as to be accessible thereby, wherein said local memory is of the type storing data in a dynamic manner and requiring periodic refresh to maintain data integrity; and local memory refresh control means for controlling said local memory refreshes such that said refreshes only occur when said processor is not requesting access to said local memory.

2. A fault tolerant computer system as set out in claim 1, wherein said processor provides a warning signal prior to accessing said local memory and wherein said local memory refresh control means receives said warning signal and delays any pending local memory refreshes in response thereto.

3. A fault tolerant computer system as set out in claim 2, wherein each said processor module further comprises means for receiving a processor request, partially decoding said request, and issuing a second warning signal to said local memory refresh controller means in response thereto.

4. A fault tolerant computer system as set out in claim 3, wherein said local memory refresh controller means receives said second warning signal and delays any pending local memory refreshes by a predetermined time in response thereto.

5. A fault tolerant computer system as set out in claim 4, wherein said predetermined period of time is one clock cycle.

6. A fault tolerant computer system as set out in claim 4, wherein each of said processor modules further comprises means for receiving a processor local memory access request and further decoding said instruction to provide a third warning signal to said local memory refresh controller means.

7. A fault tolerant computer system as set out in claim 6, wherein said local memory refresh control means aborts any pending local memory refreshes in response to said third warning signal.

8. A fault tolerant computer system as set out in claim 1, wherein said local memory refresh control means comprises a timer receiving said clock cycles and periodically providing a local memory refresh signal and memory control means responsive to said memory refresh control signal for initiating a local memory refresh in response to said signal only if an impending local memory access by the processor is not detected.

9. A fault tolerant computer system as set out in claim 1, wherein each of said local memories is clocked synchronously with the respective processor with which it is configured within a processor module and wherein said fault tolerant computer system further comprises one or more external memories clocked asynchronously with said processor modules.

10. A refresh controller for use with a computer system having a processor, a dynamic memory accessed by said processor, said processor issuing access requests prior to accessing said dynamic memory, and wherein said dynamic memory is of the type requiring periodic refreshes to maintain the integrity of data stored therein, and a clock for providing clock cycles, comprising:

a refresh timer receiving said clock cycles and issuing a refresh request signal at predetermined refresh intervals;

access warning means for receiving a request from said processor and providing a warning signal in response thereto; and refresh timing control means, coupled to said refresh timer and warning means and receiving said refresh request signal and said warning signal, for initiating a dynamic memory refresh in response to said refresh request signal and for stalling said refresh for a predetermined number of clock cycles in response to said warning signal.

11. A refresh controller as set out in claim 10, further comprising means for receiving a processor access request, decoding said request, and issuing a second warning signal to said refresh timing control means.

12. A refresh controller as set out in claim 11, wherein said refresh timing control means receives said second warning signal and delays any pending refresh by a predetermined period of time in response thereto.

13. A refresh controller as set out in claim 12, wherein said predetermined period of time is one clock cycle.

14. A refresh controller as set out in claim 11, further comprising means for receiving said processor access request and further decoding said request to provide a third warning signal to said refresh timing control means.

15. A refresh controller as set out in claim 14, wherein said refresh timing control means aborts any pending memory refresh in response to said third warning signal.

16. An apparatus for controlling the refresh of a dynamic random access memory employed in a computer system having a processor, periodically accessing said dynamic random access memory and issuing memory access requests prior to such accessing, comprising:

means for issuing a refresh request at predetermined refresh intervals;

means for initiating a dynamic memory refresh in response to said refresh request signal;

means for receiving a request for access to said dynamic memory from said processor and providing a warning signal in response thereto; and means for stalling said refresh for a predetermined number of clock cycles in response to said warning signal.

17. A fault tolerant computer system for processing an instruction stream, comprising:

first, second and third processors of substantially identical configuration, said first, second and third processors having independent clocks providing independent clock cycles, each of said processors periodically issuing a command;

first, second and third local memories respectively clocked synchronously with said first, second and third processors and accessible thereby, wherein said first, second and third local memories are of the dynamic type requiring periodic refresh to maintain data integrity of data stored therein;

wherein said first, second and third processors issue one of a plurality of commands, wherein execution of predetermined ones of the plurality of commands involves accessing at least one of said first, second and third local memories; and first, second and third local memory refresh control means for periodically initiating a speculative local memory refresh operation and for, in response to said issued processor command, stalling said speculative local memory refresh for a predetermined period of time.

18. A fault tolerant computer system as set out in claim 17, wherein said predetermined period of time is one clock cycle.

19. A fault tolerant computer system as set out in claim 17, wherein said first, second and third local memory refresh control means each further comprises means for decoding said processor command and in response to a decoded command indicting a local memory access, aborting said speculative refresh.

* * * * *